United States Patent
Karkkainen et al.

(10) Patent No.: US 11,634,610 B2
(45) Date of Patent: Apr. 25, 2023

(54) SILOXANE POLYMER COMPOSITIONS AND THEIR USE

(71) Applicant: OPTITUNE Oy, Oulu (FI)

(72) Inventors: Ari Karkkainen, Oulu (FI); Milja Hannu-Kuure, Oulu (FI); Admir Hadzic, Oulu (FI); Jarkko Leivo, Oulu (FI); Henna Jarvitalo, Oulu (FI); Rauna-Leena Kuvaja, Oulu (FI); Graeme Gordon, Oulu (FI); Matti Pesonen, Oulu (FI)

(73) Assignee: OPTITUNE Oy, Oulu (FI)

( * ) Notice: Subject to any disclaimer, the term of this patent is extended or adjusted under 35 U.S.C. 154(b) by 0 days.

(21) Appl. No.: 17/479,009

(22) Filed: Sep. 20, 2021

(65) Prior Publication Data

US 2022/0010172 A1  Jan. 13, 2022

Related U.S. Application Data

(62) Division of application No. 15/557,620, filed as application No. PCT/FI2016/050166 on Mar. 17, 2016, now abandoned.

(Continued)

(30) Foreign Application Priority Data

Mar. 17, 2015  (FI) ..................................... 20155186

(51) Int. Cl.
*B05D 5/00* (2006.01)
*C09D 183/14* (2006.01)
(Continued)

(52) U.S. Cl.
CPC ........... *C09D 183/14* (2013.01); *G03F 7/038* (2013.01); *G03F 7/075* (2013.01); *G03F 7/0757* (2013.01);
(Continued)

(58) Field of Classification Search
CPC ...... C09D 183/14; C08G 77/52; C08G 77/20; C08G 77/14; C08G 77/50; G03F 7/075;
(Continued)

(56) References Cited

U.S. PATENT DOCUMENTS 6,037,394 A  3/2000 Sato et al.
6,277,535 B1 *  8/2001 Liu .................. G03G 5/142
430/131

(Continued)

FOREIGN PATENT DOCUMENTS

CN  101353479 A  1/2009
CN  101946209 A  1/2011
(Continued)

OTHER PUBLICATIONS

JP-2014080567-A English translation. (Year: 2022).*
(Continued)

*Primary Examiner* — Hai Y Zhang
(74) *Attorney, Agent, or Firm* — Oblon, McClelland, Maier & Neustadt, L.L.P.

(57) ABSTRACT

The present invention provides a method for covering a substrate, and includes the following operations: (a) admixing at least four different silane monomers and at least one bi-silane to a first solvent(s) to form a mixture, with the proviso that at least one of the silane monomers or the bi-silane comprises an active group capable of achieving cross-linking to adjacent siloxane polymer chains of the siloxane polymer composition; (b) subjecting the mixture to an acid treatment so that the silane monomers are at least partially hydrolysed, and the hydrolysed silane monomers, the silane monomers and the bi-silane are at least partially polymerized and cross-linked; (c) optionally changing the first solvent to a second solvent; and (d) subjecting the mixture to further cross-linking of the siloxane polymer to (Continued)

achieve a predetermined degree of cross-linking, depositing the siloxane polymer composition on the substrate, and optionally curing the deposited siloxane polymer composition.

19 Claims, 4 Drawing Sheets

Related U.S. Application Data

(60) Provisional application No. 62/134,032, filed on Mar. 17, 2015.

(51) Int. Cl.
*G03F 7/038* (2006.01)
*G03F 7/075* (2006.01)
*C08G 77/52* (2006.01)
*C08G 77/14* (2006.01)
*C08G 77/20* (2006.01)
*C08G 77/50* (2006.01)

(52) U.S. Cl.
CPC ............ *C08G 77/14* (2013.01); *C08G 77/20* (2013.01); *C08G 77/50* (2013.01); *C08G 77/52* (2013.01)

(58) Field of Classification Search
CPC ......... G03F 7/0757; G03F 7/038; B05D 5/00; B05D 2518/10
See application file for complete search history.

(56) References Cited

U.S. PATENT DOCUMENTS

| | | | |
|---|---|---|---|
| 6,706,403 B1* | 3/2004 | Olofson | H01J 29/896 428/447 |
| 2004/0086542 A1* | 5/2004 | Hossainy | A61L 31/16 427/2.28 |
| 2007/0155897 A1* | 7/2007 | Tani | C09D 183/14 524/837 |
| 2008/0145790 A1* | 6/2008 | Baumann | G03F 7/322 430/302 |
| 2010/0330505 A1 | 12/2010 | Nakajima et al. | |
| 2011/0111340 A1* | 5/2011 | Karkkainen | C08K 5/0025 430/270.1 |
| 2015/0048046 A1 | 2/2015 | Dei et al. | |
| 2015/0294247 A1 | 10/2015 | Munakata et al. | |

FOREIGN PATENT DOCUMENTS

| | | | |
|---|---|---|---|
| JP | 2011-505448 A | | 2/2011 |
| JP | 2014-80567 A | | 4/2014 |
| JP | 2014080567 A | * | 5/2014 |
| JP | 2015-201103 A | | 11/2015 |
| WO | WO 2005/059051 A1 | | 12/2007 |
| WO | 2009/068755 A1 | | 6/2009 |

OTHER PUBLICATIONS

International Search Report dated Jun. 10, 2016 in PCT/FI2016/050166 filed Mar. 17, 2016.
Combined Office Action and Search Report dated May 27, 2019 in Chinese Patent Application No. 201680015423.8 with English translation of categories of cited documents.
Office Action (Notification of Reasons for Refusal dated Mar. 23, 2020) in Japanese Patent Application No. 2017-548295, with English translation.

* cited by examiner

SILOXANE POLYMER COMPOSITIONS AND THEIR USE

CROSS REFERENCE TO RELATED APPLICATIONS

This application is a divisional application of prior U.S. application Ser. No. 15/557,620, filed Sep. 12, 2017, the disclosure of which is incorporated herein by reference in its entirety. U.S. application Ser. No. 15/557,620 is the national stage of PCT/FI2016/050166 filed Mar. 17, 2016, the disclosure of which is incorporated herein by reference in its entirety. U.S. application Ser. No. 15/557,620 claims priority to U.S. Provisional Application No. 62/134,032, filed Mar. 17, 2015, and to Finland Application No. 20155186, filed Mar. 17, 2015, the disclosures of which are incorporated herein by reference in their entireties.

FIELD

The present invention relates to siloxane polymer compositions. In particular, the invention relates to siloxane polymer compositions which have suitable properties for use in a lithographic fabrication processes. The invention also relates to synthesis, polymerization and cross-linking of such compositions.

BACKGROUND

Display and semiconductor devices are constructed of multiple coating layers and patterned layers applied on substrate(s) or other coating layers to deliver specific functions in the device. The coating layers are typically deposited by sputtering, chemical vapour deposition, electron beam and by other physical vapour deposition techniques or the coating layers are deposited from a liquid phase using a number of different liquid phase coating methods. These layers will typically undergo patterning steps by lithography and wet or dry etching or other subtractive or additive processes to produce the final desired coating, patterns and structures on a substrate.

The liquid phase materials are typically directly patterned by lithography process, or by other additive patterning techniques. The liquid phase deposited coating layers are typically either thermally cured or cured by a combined UV and thermal treatment. While running the physical vapour deposition processes, the coating layers (and substrate) are subject to elevated temperatures during the coating process. In addition, when the multilayer stacks are manufactured, the substrate and the coating layers will undergo multiple heat cycles and will be exposed to various chemical etch solutions during the manufacturing process. The coating layers have to have sufficient chemical resistivity against the aggressive etch solutions, deliver good thermal and environmental stability, non-yellowing characteristics and high optical quality. In addition, the coating layers have to have good compatibility in terms of adhesion and to have sufficient hardness. The manufacturers are constantly pushing towards higher integration on device level and designing more and more advanced form factors, which sets further challenges and process limitations for the coating layers. One significant requirement to meet is to deliver same performance at low cure temperature.

Although there are coating layers suitable for display and semiconductor technology, there is still need for further improvements in coating layers and in methods for their manufacture.

SUMMARY

The following presents a simplified summary in order to provide a basic understanding of some aspects of various invention embodiments. The summary is not an extensive overview of the invention. It is neither intended to identify key or critical elements of the invention nor to delineate the scope of the invention. The following summary merely presents some concepts of the invention in a simplified form as a prelude to a more detailed description of exemplifying embodiments of the invention.

In accordance with the invention, there is provided a new method for producing a siloxane polymer the method including steps of
(a) admixing a first solvent(s), at least four different silane monomers and at least one bi-silane, to form a mixture,
   with the proviso that at least one of the silane monomers or the bi-silane includes an active group capable of achieving cross-linking to adjacent siloxane polymer chains;
(b) subjecting the mixture to an acid treatment so that the silane monomers are at least partially hydrolysed, and the hydrolysed silane monomers, the silane monomers and the bi-silane are at least partially polymerized and at least partially cross-linked;
(c) optionally changing the first solvent to a second solvent; and
(d) subjecting the mixture to a conditions conducive to achieving further cross-linking of the siloxane polymer.

According to another aspect the present invention concerns a siloxane polymer composition obtainable by
(a) admixing a first solvent(s) and at least four different silane monomers and at least one bis-silane, to form a mixture,
   with the proviso that at least one of the silane monomers or the bi-silane includes an active group capable of achieving cross-linking to adjacent siloxane polymer chains;
(b) subjecting the mixture to an acid treatment so that the silane monomers are at least partially hydrolysed, and the hydrolysed silane monomers, the silane monomers and the bi-silane are at least partially polymerized and at least partially cross-linked;
(c) optionally changing the first solvent to a second solvent, and
(d) subjecting the mixture to further cross-linking of the siloxane polymer.

According to another aspect the present invention concerns use of the siloxane polymer composition according to the present invention in a process for manufacture of a display or a semiconductor device.

According to another aspect the present invention concerns a method for covering a substrate, the method including
   providing a siloxane polymer composition obtainable by the method of the present invention, and depositing the siloxane polymer composition on the substrate.

According to still another aspect, the present invention concerns a composition including at least four different silane monomers and at least one bi-silane, wherein at least one of the silane monomers or the bi-silane includes an active group capable of achieving cross-linking, upon thermal or radiation initiation, and a solvent.

Further aspects of the present invention are disclosed in dependent claims.

Various exemplifying and non-limiting embodiments of the invention both as to constructions and to methods of operation, together with additional objects and advantages thereof, will be best understood from the following description of specific exemplifying embodiments when read in connection with the accompanying drawings.

The verbs "to comprise" and "to include" are used in this document as open limitations that neither exclude nor require the existence of also un-recited features. The features recited in depending claims are mutually freely combinable unless otherwise explicitly stated.

EMBODIMENTS

Figure 1:
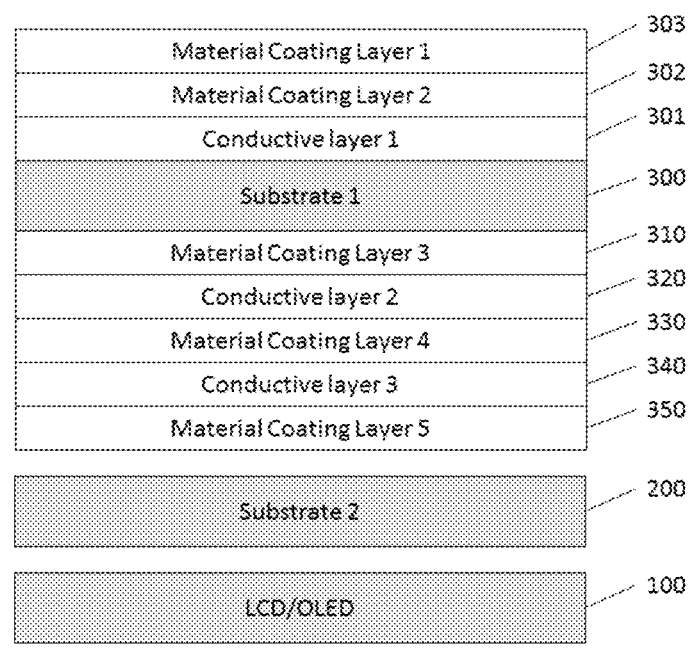
FIG. 1 illustrates a cross-section of an exemplary display device structure wherein multiple coating layers are used to deliver specific functions.

According to one embodiment the invention of the present disclosure concerns a method for producing a siloxane polymer, the method including
(a) admixing a first solvent(s), at least four different silane monomers and at least one bis-silane, to form a mixture,
  with the proviso that at least one of the silane monomers or the bis-silane includes an active group capable of achieving cross-linking to adjacent siloxane polymer chains for example upon a thermal or radiation initiation;
(b) subjecting the mixture to an acid treatment so that the silane monomers are at least partially hydrolysed, and the hydrolysed silane monomers, the silane monomers and the bis-silane are at least partially polymerized and cross-linked;
(c) optionally changing the first solvent to a second solvent; and
(d) subjecting the mixture to conditions conducive to further cross-linking of the siloxane polymer.

The conditions conducive to further cross-linking of the siloxane polymer are formed, for example, by thermal or radiation initiation or a combination thereof.

According to another aspect the present invention concerns a siloxane polymer composition obtainable by
(a) admixing a first solvent(s), at least four different silane monomers, and at least one bi-silane, to form a mixture,
  in proviso that at least one of the silane monomers or the bi-silane includes an active group capable of achieving cross-linking to adjacent siloxane polymer chains for example upon a thermal or radiation initiation;
(b) subjecting the mixture to an acid treatment so that the silane monomers are at least partially hydrolysed, and the hydrolysed silane monomers, the silane monomers and the bis-silane are at least partially polymerized and cross-linked;
(c) optionally changing the first solvent to a second solvent; and
(d) subjecting the mixture to for example thermal or radiation initiation so that further cross-linking of the siloxane polymer is achieved.

At least one of the silane monomers or the bi-silane must include an active group which is capable of achieving cross-linking to adjacent siloxane polymer chains upon a thermal or radiation initiation. Exemplary active groups are epoxy, vinyl, allyl and methacrylate groups.

Exemplary thermal initiation is subjecting the mixture to a radical initiator. Exemplary radical initiators are tert-amyl peroxybenzoate, 4,4-azobis(4-cyanovaleric acid), 1,1'-azobis(cyclohexanecarbonitrile), benzoyl peroxide, 2,2-bis(tert-butylperoxy)butane, 1,1-bis(tert-butylperoxy)cyclohexane, 2,2'-azobisisobutyronitrile (AIBN), 2,5-bis(tert-butylperoxy)-2,5-dimethylhexane, 2,5-bis(tert-Butylperoxy)-2,5-dimethyl-3-hexyne, bis(1-(tert-butylperoxy)-1-methylethyl) benzene, 1,1-bis(tert-butylperoxy)-3,3,5-trimethylcyclohexane, tert-butyl hydroperoxide, tert-butyl peracetate, tert-butyl peroxide, tert-butyl peroxybenzoate, tert-butylperoxy isopropyl carbonate, bumene hydroperoxide, byclohexanone peroxide, bicumyl peroxide, lauroyl peroxide, 2,4-pentanedione peroxide, peracetic acid, and potassium persulfate.

In one embodiment, the radical initiator is AIBN.

Usually, the temperature of the cross-linking is in the range of about 30 to 200° C., typically cross-linking is carried out at refluxing conditions of the solvent.

Exemplary radiation initiation is subjecting the mixture to UV light. Radical initiators and photoacid/base generators (both non-ionic and ionic and cationic and anionic) can be used as UV initiators. Examples of such initiators include Ircacure 819, 184, 651, 907, 1173, 2022, 2100, Rhodorsil 2074 and Cyracure UVI-6976, Irgacure PAG 103, 121, 203, 250, 290 and CGI 725, 1907 amd GSID26-1, OXE-1, OXE-2, TPO, TPS and the like. Furthermore, sensitizers can be used in combination with the initiators to further accelerate the polymerization, by providing effective energy transfer to the UV polymerization initiators. Examples of such sensitizers include UVS-1331, UVS-1101, UVS-1221, 2,4-diethyl-9H-thioxanthen-9-one, and the like.

In an embodiment, the synthesis of the siloxane polymer is carried out in two steps.

In the first synthesis step of an embodiment, in the following also called the hydrolysis step, the monomers are hydrolysed in a first solvent in presence of catalyst. Such a catalyst is formed by an acid or mixture thereof. An example of catalysts is an aqueous acid e.g. nitric acid or hydrochloric acid or another mineral or organic acid.

In the second step, the polymerization step, the molecular weight of the material is increased by condensation polymerization. The water used in the hydrolysis step has typically a pH of less than 7, preferably less than 6, in particular less than 5.

During hydrolysis, a partial condensation is started and a relatively low molecular weight polymer is formed.

According to a preferable embodiment the subjecting the mixture to an acid treatment includes refluxing. A typical refluxing time is 2 h.

The monomers are condensation polymerized to achieve the final siloxane polymer composition. Generally, in case of tri-, di- and monofunctional molecules, the other functional groups (depending on the number of hydrolysable group number) of the precursor molecules can be organic functionalities such as linear, alkyl, alkene, aryl, cyclic, aliphatic groups. As examples of the organic groups, methyl group, ethyl group, propyl group, butyl group, octyl group, decyl group and the like can be used. The alkyl group preferably includes 1 to 10 carbon atoms. The alkyl group may be either linear or branched. A hydrogen atom in the organic group may be replaced by a fluorine atom or similar. Further examples include optionally substituted phenyl group, naphthyl group, hydroxyphenyl, phenanthrene, methylphenyl group, ethylphenyl group, chlorophenyl group, bromophenyl group, fluorophenyl group, diphenyl group, thioxanthone.

At least one of the organic groups contain reactive functional groups e.g. amine, epoxy, acryloxy, allyl, methacryl or vinyl groups. These reactive organic groups can react during the thermal or radiation initiated curing step. Thermal and radiation sensitive initiators can be used to achieve specific curing properties from the material composition. When using the radiation sensitive initiators the material can perform as a negative tone photosensitive material in the lithography process.

According to one embodiment, the method of the present invention includes admixing at least one bi-silane and at least four silane monomers according to formulas I, II, III and IV:

$$R^1_a SiX_{4-a} \quad \text{I}$$

$$R^2_b SiX_{4-b} \quad \text{II,}$$

$$R^3_c SiX_{4-c} \quad \text{III, and}$$

$$R^4_d SiX_{4-d} \quad \text{IV}$$

wherein $R^1$, $R^2$, $R^3$ and $R^4$ are independently selected from hydrogen and a group comprising linear and branched alkyl, cycloalkyl, alkenyl, alkynyl, (alk)acrylate, epoxy, allyl, vinyl and alkoxy and aryl having 1 to 6 rings, and wherein the group is substituted or unsubstituted; X is a hydrolysable group or a hydrocarbon residue; a, b, c and d is an integer 1 to 3.

In any of the formulas above, the hydrolysable group is in particular an alkoxy group (cf. formula V).

According to an embodiment, the present invention provides for the production of organosiloxane polymers using tri- or tetraalkoxysilane. The alkoxy groups of the silane can be identical or different and preferably selected from the group of radicals having the formula $$-O-R^5 \quad \text{V}$$

wherein $R^5$ stands for a linear or branched alkyl group having 1 to 10, preferably 1 to 6 carbon atoms, and optionally exhibiting one or two substituents selected from the group of halogen, hydroxyl, vinyl, epoxy and allyl.

Particularly suitable monomers are selected from the group of triethoxysilane, tetraethoxysilane, methyltriethoxysilane, methyltrimethoxysilane, ethyltriethoxysilane, n-butyltriethoxysilane, methyldiethoxyvinylsilane, dimethyldiethoxysilane, phenyltrimethoxysilane, phenantrene-9-triethoxysilane, vinyltrimethoxysilane, 3-glysidoxypropyltrimethoxysilane, aminopropyltrimethoxysilane, methacryloxypropyltrimethoxysilane, methacryloxypropyltriethoxysilane, acryloxypropyl-trimethoxysilane, allyltrimethoxysilane, epoxycyclohexylethyltrimethoxysilane, diphenylsilanediol, 1,2-bis(trimethoxysilyl)methane, 1,2-bis(trimethoxysilyl)ethane, glycidylmethacrylate, dimethyldimethoxysilane, 1-(2-(Trimethoxysilyl)ethyl)cyclohexane-3,4-epoxide, 1,2-bis(triethoxysilyl)ethane, 1H, 1H, 2H, 2H-perfluorodecyltrimethoxysilane, trimethoxy (3,3,3-trifluoropropyl)silane and combinations thereof.

The method of the present invention includes admixing at least one bi-silane with other monomer(s), for example monomers of the above kind (formulas I to IV). According to an embodiment the bi-silane is selected from molecules corresponding to formula VI:

$$(R^6)_3Si-Y-Si(R^7)_3, \quad \text{VI}$$

wherein
$R^6$ and $R^7$ are independently selected from hydrogen and a group consisting of linear or branched alkyl, cycloalkyl, alkenyl, alkynyl, (alk)acrylate, epoxy, allyl, vinyl, alkoxy and aryl having 1 to 6 rings, and wherein the group is substituted or unsubstituted; and
Y is a linking group selected from bivalent unsubstituted or substituted aliphatic and aromatic groups, such as alkylene, arylene, —O-alkylene-O—; —O-arylene-O—; alkylene-O-alkylene, arylene-O-arylene; alkylene-$Z^1C(=O)Z^2$-alkylene, arylene-$Z^1C(=O)Z^2$-arylene and —O-alkylene-$Z^1(=O)Z^2$-alkylene-O—; —O-arylene-$Z^1(=O)Z^2$-arylene-O—, wherein $Z^1$ and $Z^2$ are each selected from a direct bond or —O—.

In the bivalent "alkylene" groups and other similar aliphatic groups, the alkyl residue (or residue derived from an alkyl moiety) stands for 1 to 10, preferably 1 to 8, or 1 to 6 or even 1 to 4 carbon atoms, examples include ethylene and methylene and propylene.

"Arylene" stands for an aromatic bivalent group containing typically 1 to 3 aromatic rings, and 6 to 18 carbon atoms. Such groups are exemplified by phenylene (e.g. 1,4-phenylene and 1,3-phenylene groups) and biphenylene groups as well as naphthylene or anthracenylene groups.

The alkylene and arylene groups can optionally be substituted with 1 to 5 substituents selected from hydroxy, halo, vinyl, epoxy and allyl groups as well as alkyl, aryl and aralkyl groups.

Preferred alkoxy groups contain 1 to 4 carbon atoms. Examples are methoxy and ethoxy.

The term "phenyl" includes substituted phenyls such as phenyltrialkoxy, in particular phenyltrimethoxy or triethoxy, and perfluorophenyl. The phenyl as well as other aromatic or alicyclic groups can be coupled directly to a silicon atom or they can be coupled to a silicon atom via a methylene or ethylene bridge.

Exemplary bi-silanes include 1,2-bis(trimethoxysilyl)methane, 1,2-bis(triethoxysilyl)methane, 1,2-bis(trimethoxysilyl)ethane, 1,2-bis(triethoxysilyl)ethane, 1-(dimethoxymethylsilyl)-1-(trimethoxysilyl)methane, 1-(diethoxymethylsilyl)-1-(triethoxysilyl)methane, 1-(dimethoxymethylsilyl)-2-(trimethoxysilyl)ethane, 1-(diethoxymethylsilyl)-2-(triethoxysilyl)ethane, bis(dimethoxymethylsilyl)methane, bis(diethoxymethylsilyl)methane, 1,2-bis(dimethoxymethylsilyl)ethane, 1,2-bis(diethoxymethylsilyl)ethane, 1,2-bis(trimethoxysilyl)benzene, 1,2-bis(triethoxysilyl)benzene, 1,3-bis(trimethoxysilyl)benzene, 1,3-bis(triethoxysilyl)benzene, 1,4-bis(trimethoxysilyl)benzene, 1,4-bis(triethoxysilyl)benzene.

Further examples include: 4,4'-Bis(triethoxysilyl)-1,1'-biphenyl; 1,4-Bis(triethoxysilyl)benzene; 1,3-Bis(triethoxysilyl)benzene In the present context, the term "bi-silane" is used for designating a compound comprising two organic residues, in particular silicon containing residues, which are linked to the same atom(s). In case of two identical (or even symmetrical) organic residues, the term "bis-silane" is also used.

According to a particular embodiment the silane monomers are selected from methyltriethoxysilane, phenyltrimethoxysilane, 3-methacryloxypropyltrimethoxysilane, diphenylsilanediol, and glycidoxypropyltrimethoxysilane, and the bis-silane is selected from 1,2-bis(triethoxysilyl)ethane, and 1,2-bis(trimethoxysilyl)methane.

According to a preferred embodiment, when using the above monomers, at least one of the monomers used for hydrolysis and condensation is selected from monomers having formulas I or II, wherein at least one substituent is an active group capable of achieving cross-linking to adjacent siloxane polymer chains upon a thermal or radiation initiated curing step.

For preparing the polymer, the molar portion of units derived from monomers of the above kind (or the molar portion of monomers containing the active group calculated from the total amount of monomers) is about 0.1 to 70%, preferably about 0.5 to 50%, in particular about 1 to 40%.

In some embodiments, the active group will be present in a concentration of about 1 to 35% based on the molar portion of monomers.

It is preferable to have the bi-silane (or bis-silane) molar amount between 1-50%, preferably between 3-35%.

According to an embodiment at least one of the at least four different silane monomers comprises one or more reactive functional groups which are capable of achieving further cross-linking of the siloxane polymer under initiation by a photo or thermal initiator compound.

In an embodiment, two or more polymers are separately produced and admixed to form the aimed composition. In such an embodiment, for example, all but one or two monomers are polymerized in suitable liquid to form a first polymer and the remaining monomer or monomers are separately polymerized to form a second polymer and the two polymers are then mixed to form the final polymer composition. In one embodiment, the first polymer makes up the majority of the final polymer composition. In particular the first and the second polymers are mixed at a polymer weight ratio of 1.1:1 to 100:1, in particular 1.5:1 to 50:1, for example 2:1 to 15:1. In the below examples, the ratios are in the range of 2.5:1 to 7.5:1.

Thus, based on the above, one embodiment for producing a siloxane polymer composition comprises the steps of
(a) providing at least four different silane monomers and at least one bi-silane;
 admixing at least two silane monomers and at least one bi-silane with a first solvent(s) to form a first mixture,
 admixing at least one silane monomer with a second solvent(s), to form a second mixture,
  with the proviso that at least one of the silane monomers or the bi-silane comprises an active group capable of achieving cross-linking to adjacent siloxane polymer chains of the siloxane polymer composition;
(b) subjecting the first and the second mixtures to acid treatment so that the silane monomers are at least partially hydrolysed, and the hydrolysed silane monomers, the silane monomers and the bi-silane are at least partially polymerized and cross-linked to form a first and a second polymer composition;
(c) optionally changing the first and the second solvents to a third solvent;
(d) mixing the first and the second polymer compositions to form a combined polymer composition and
(e) subjecting the combined polymer composition to further cross-linking of the siloxane polymer to achieve a predetermined degree of cross-linking.

In one embodiment, the second polymer is obtained by polymerizing at least one monomer containing an active group, in particular an active group capable of achieving cross-linking to adjacent siloxane polymer chains upon a thermal or radiation initiation. The active group can be any of the above discussed, in particular it is selected from epoxy, vinyl, allyl and methacrylate groups and combinations thereof.

In one embodiment, the first polymer contains the bi-silane monomer.

The method for producing a siloxane polymer is performed in a first solvent. Suitable solvents are, for example, acetone, tetrahydrofuran (THF), toluene, 2-propanol, methanol, ethanol, propylene glycol propyl ether, methyl-tert-butylether (MTBE), propylene glycol monomethylether acetate (PGMEA), methyl ethyl ketone, methyl isobutyl ketone, propylene glycol monomethylether (PGME) and propylene glycol propyl ether (PnP). According to an embodiment the method further includes changing the first solvent to a second solvent. The solvent change is done after the treatment with acid. The first solvent is preferably selected from acetone, 2-propanol, 1-propanol, methyl ethyl ketone, methyl isobutyl ketone, 1-methoxy-2-propanol or PGMEA, and the second solvent is preferably selected from PGMEA, 1-methoxy-2-propanol, methyl ethyl ketone, PGMEA or PnP or methyl isobutyl ketone, cyclopentatone or mixtures thereof.

The solvent change is advantageous, since it assists the removal of water and alcohols formed during hydrolysis of the silane monomers. In addition, it improves the properties of the final siloxane polymer solution when used as coating layer(s) on substrate.

In case of the preparation of a first and a second polymer which are mixed with each other, the polymerization is carried out separately for each polymer as explained above in liquid phase and optionally followed by solvent exchanged. Preferably the solvent exchange is carried out such that the first solvents for the production of the first and the second polymers are changed for the same second solvent.

The siloxane polymer prepared according to the method of the present invention is partially cross-linked. In the present context, the term "partially cross-linked" means that the polymer is capable of further cross-linking at conditions conducive to cross-linking. In practice, the polymer still contains at least some reactive, cross-linking groups after the first polymerisation step. The further cross-linking will be described below.

The molecular weight range of the siloxane polymer which is partially cross-linked is in the range of 1500 to 35,000, preferably about 2,000 to 30,000, in particular about 4,000 to 25,000 g/mol. The polymer molecular weight can be adjusted to make it suitable for use with a specific developer in a lithographic patterning process.

According to an embodiment, the method further comprising admixing nanoparticles (or similar nano-, or microscale rods, crystals, spheres, dots, buds etc.) to the polymer compositions. The nanoparticles are in particular selected from the group of light scattering pigments, organic and inorganic phosphors, oxides, quantum dots or metals. The above mentioned dopants can improve coating material mechanical, chemical or physical properties or provide added functionality for the layer.

To improve resolution of the material when applied to photolithography, the siloxane polymer is partially cross-linked during polymerization, in particular during or immediately after condensation polymerization. Various methods can be used for achieving cross-linking. For example, cross-linking method where two chains are joined via reactive groups not affecting any of the active groups intended for the UV photolithography can be employed. To mention an example, hydrosilylation for example using a proton on one chain reacting with a double bond on another chain will achieve cross-linking of desired kind. Another example is cross-linking through double bonds. Different active groups are preferably used for cross-linking and for photolithography. Thus, the cross-linking of the siloxane polymer can be achieved with an active group having double bonds, such as a vinyl or allyl or methacrylate group using radical initiators.

Epoxy groups can be employed for UV-lithography. And visa versa. The proportion of active groups required for cross-linking is generally smaller than for UV lithography, e.g. about 0.1 to 10 mol %, based on the monomers, for cross-linking and about 5 to 35 mol %, based on the monomers, for UV lithography.

The amount of the initiator added to the reaction mixture/solution is generally about 0.1 to 10%, preferably about 0.5 to 5%, calculated from the mass of the siloxane polymer. As a result of the partial cross-linking, the molecular weight will typically be 2- to 10-folded. Thus from a molecular weight in the range of about 500 to 2500 g/mol, the cross-linking will increase it to 4,000 or more, preferably to 4,000 or higher (4,000-30,000 g/mol).

Before further condensation the excess of water is preferably removed from the material and at this stage it is possible to make a solvent exchange to another synthesis solvent if desired. This other synthesis solvent may function as the final or one of the final processing solvents of the siloxane polymer. The residual water and alcohols and other by-products may be removed after the further condensation step is finalized. Additional processing solvent(s) may be added during the formulation step to form the final processing solvent combination. Additives such as thermal initiators, radiation sensitive initiators, sensitizers, surfactants and other additives may be added prior to final filtration of the siloxane polymer. After the formulation of the composition, the polymer is ready for processing in, for example, a lithographic process.

By adjusting the hydrolysis and condensation conditions it is possible to control the concentration/content of the group capable of being deprotonated (e.g. an OH-group) and any residual leaving groups from the silane precursors (e.g. alkoxy groups) of the siloxane polymer composition and also to control the final molecular weight of the siloxane polymer. This greatly affects dissolution of the siloxane polymer material into the aqueous based developer solution. Furthermore, the molecular weight of the polymer also greatly effects on the dissolution properties of the siloxane polymer into developer solutions.

Thus, for example, it has been found that when the final siloxane polymer has a high content of hydroxyl groups remaining and a low content of alkoxy (e.g. ethoxy) groups, the final siloxane polymer can be dissolved into an alkaline-water developer solution (e.g. tetra methyl ammonium hydroxide; TMAH, or potassium hydroxide; KOH), sodium carbonate ($Na_2CO_3$) and potassium carbonate ($K_2CO_3$).

On the other hand if the remaining alkoxy-group content of the final siloxane polymer is high and it contains hardly any OH-groups, the final siloxane polymer has a very low solubility in an alkaline-water developer of the above kind. The OH-groups or other functional groups, such as amino ($NH_2$), thiol (SH), carboxyl, phenol or similar that result in solubility to the alkaline developer systems, can be attached directly to the silicon atoms of the siloxane polymer backbone or optionally attached to organic functionalities attached into the siloxane polymer backbone to further facilitate and control the alkaline developer solubility.

After synthesis, the siloxane polymer composition can be diluted using a proper solvent or solvent combination to give a solid content which in film deposition will yield the pre-selected film thickness.

Usually, a further amount of an initiator molecule compound is added to the siloxane composition after synthesis. The initiator, which can be optionally similar to the one added during polymerization, is used for creating a species that can initiate the polymerization of the "active" functional group in the UV curing step. Thus, in case of an epoxy group, cationic or anionic initiators can be used. In case of a group with double bonds as "active" functional group in the synthesized material, radical initiators can be employed. Also thermal initiators (working according to the radical, cationic or anionic mechanism) can be used to facilitate the cross-linking of the "active" functional groups. The choice of a proper combination of the photoinitiators and sensitizers also depends on the used exposure source (wavelength). Furthermore the selection of the used sensitizer depends on the selected initiator type.

In connection photoinitiators and sensitizers it is possible to use inhibitors, quenchers and other additives to affect the lithography performance, dissolution of deposited film to developer and improve material storage stability.

The concentration of the thermal or radiation initiator and sensitizers in the composition is generally about 0.1 to 10%, preferably about 0.5 to 5%, calculated from the mass of the siloxane polymer.

The composition as described above may comprise solid nanoparticles in an amount of between 1 and 50 wt-% of the composition. The nanoparticles (or similar nano-, or microscale rods, crystals, spheres, dots, buds etc.) are in particular selected from the group of light scattering pigments, organic and inorganic phosphors, oxides, quantum dots or metals.

According to another embodiment, the present invention concerns a method for covering a substrate, the method including
  providing a siloxane polymer composition obtainable by the method described above and
  depositing the siloxane polymer composition on the substrate.

The deposited siloxane polymer composition forms a film, in particular a thin film on the substrate, in particular the surface of the substrate. Typically, after deposition, or during the deposition step, the solvent is evaporated and the film dried, preferably by thermal drying. This step is also referred to as pre-curing.

In a second, subsequent step the film is cured to final hardness by increasing the temperature. In one embodiment, the pre-curing and the final curing steps are combined by carrying out heating by using an increasing heating gradient.

According to a particular embodiment the method further includes developing the deposited film. In one embodiment, developing comprises exposing (full area or selective exposure using photomask or reticle or laser direct imaging) the deposited siloxane polymer composition to UV light. The step of developing is typically carried out after any pre-curing step and before a final curing step.

Thus, in one embodiment the method comprises
  pre-curing or drying the siloxane polymer film (or structure) deposited on the substrate;
  optionally exposing the thus obtained film (or structure);
  optionally developing the thus obtained film; and
  curing the film or structure.

Exemplary epoxy-functional group containing monomers include (3-glycidoxypropyl)trimethoxysilane, 1-(2-(Trimethoxysilyl)ethyl)cyclohexane-3,4-epoxide, (3-glycidoxypropyl)triethoxysilane, (3-glycidoxypropyl)tripropoxysilane, 3-glycidoxypropyltri(2-methoxyethoxy)silane, 2,3-epoxypropyltriethoxysilane, 3,4-epoxybutyltriethoxysilane, 4,5-epoxypentyltriethoxysilane, 5,6-epoxyhexyltriethoxysilane, 5,6-epoxyhexyltrimethoxysilane, 2-(3,4-epoxycyclohexyl)ethyltriethoxysilane, 2-(3,4-epoxycyclohexyl)ethyltrimethoxysilane, 4-(trimethoxysilyl)butane-1,2-epoxide.

According to a particular embodiment the method further includes curing the siloxane polymer composition.

The thickness of the siloxane polymer composition on the substrate (i.e. the film thicknesses) may range e.g. from 5 nm to 30 μm or higher.

Thin films can be deposited on a substrate by using slot coating, combined slot+spin coating, spin coating, spray coating, ink-jet printing, curtain coating, roller, roll-to-roll, printing (to mention few typical liquid phase deposition methods). Furthermore, the siloxane polymer composition can be deposited by directly patterning by a lithography process (or other patterning method e.g. gravure, printing, 3D/4D printing, laser direct imaging).

A film produced according to the invention typically has a dielectric constant of 3.0-5.0 or below at a frequency of 100 kHz. The index of refraction lies between 1.2 to 1.9 at a wavelength of 633 nm.

According to an embodiment, the films exhibit a cross-linking degree of 70% or more at a UV dose of 50-200 mJ/cm$^2$ at I-line or g-,h-,i-line or broadband wavelength of mercury UV source or similar used in the industry.

The final coating film thickness has to be optimized according for each device and structure fabrication process.

When, for example, PGME is employed as solvent for the synthesis, in one or both of the above-described the synthesis steps, it is not necessary to change the solvent for the final material, since PGME is regularly used also as a processing solvent in the semiconductor industry. This makes the synthesis procedure of the material easier and less time consuming.

By means of the invention, materials are provided which are suitable for produce films and structures. The layers can be deposited on various substrate surfaces, such as glass, quartz, silicon, silicon nitride, polymers, metals and plastics. Furthermore, the materials can be deposited on number of different surfaces such as different oxides, doped oxides, semimetals and the like.

The resolution in the lithography process is improved to the extent that it is better than 5 µm, preferably better than 3 µm (for thin films with a thickness of less than about 5 µm or even 4 µm). The aspect ratio is also improved: Siloxane polymer compositions according to the invention can be employed for making patterns exhibiting aspect ratios of smaller than 1:1 or even preferably smaller than 1:2.

The layers can be obtained by conventional and cost-efficient processing from the liquid phase. Such processing methods include spin-on, dip, spray, ink-jet, roll-to-roll, gravure, flexo-graphic, curtain, screen printing coating methods, extrusion coating and slit coating, but are not limited to these.

The patterning of the thermally and/or irradiation sensitive material compositions can be performed via direct lithographic patterning, conventional lithographic masking and etching procedure, imprinting and embossing, but are not limited to these.

The compositions can be used for making layers which are cured at relatively low processing temperatures, e.g. at temperatures of max 300° C. or even at temperature of 80° C. and in the range between these limits.

However, the layers formed from the compositions can also be cured at higher temperatures, i.e. temperatures over 230 and up to 400° C. In such case, the films or structures produced from the compositions can be combined with a subsequent high temperature deposition step, such as sputtering, firing, thermal evaporation and/or a CVD process.

Depending on the used substrate the material is usually cured in convection oven, by IR-lamp curing, or forced air cure between 80° C. and 300° C.

Also specifically in cases where the material layer is deposited directly on a substrate, which is already attached to the display substrate (or other substrate which can withstand a low cure temperature) the processing temperature is limited to max 150° C. or even to temperatures below 120° C. or even to temperatures below 80° C.

Typical curing time can be example 30 min at temperature. The material layer composition should deliver properties such as sufficient chemical resistivity against the aggressive etch solutions, good thermal and environmental stability, non-yellowing characteristics and high optical quality, good compatibility in terms of adhesion, sufficient hardness at the low final cure temperature (final cure temperature can be below 150° C. or below 120° C. or even below 80° C.). The material can be of course used at higher final cure temperatures (e.g. 200° C., 230° C. or higher), but it is specifically designed to deliver performance also at the low temperature.

The layers deposited from the compositions and cured as explained can perform as a planarization layer on a substrate or electronic device which may have cavities/via's and/or protruding structures on top of it. This substrate may be part of a display device (e.g. liquid crystal display or OLED display or sensor or color filter or cover substrate).

Generally, the material composition can function as optical and/or hard coating layer(s) in display devices (such as LCD or OLED display), solar cell, solar module, LED, semiconductor devices or on substrates part of an illumination device, flexible/printed/foldable/wearable electronics device.

It is also possible to use the compositions for making insulating layers on a substrate or in an electronic component. This insulating layer can also function simultaneously as a planarization layer on a substrate or in an electronic device. This substrate and/or electronic device (such as a thin film transistor or sensor or color filter or cover substrate) can be part of a display device (e.g. liquid crystal display or OLED display).

FIG. 1 represents an exemplary display device cross-section structure, wherein multiple material layers made of a siloxane polymer composition of the present invention are used to deliver specific functions. LCD/OLED substrate (100) consists the actual display (LCD or OLED) with optionally a colour filter array integrated on it e.g. as a separate glass substrate.

The substrate material in general can be various types of glass (optionally chemically or thermally tempered), quartz, plastic, polymer or metal. The substrate has typically one or two or more conductive (or semi-conductive) materials deposited and structured on its surface. The conductive (or semi-conductive) layers can for example be made of transparent conductive oxide (or doped oxide) layer or layers and/or metal layer or layers. The transparent conductive oxide can be example indium-tin-oxide (ITO) and typically is a patterned layer on the substrate surface. The transparent conductive oxide or doped oxide layers can be formed by sputtering, CVD or PVD processes. The metal layer can be a sputtered or PVD deposited metal (example Aluminium and Molybdenum). The conductive layer can also be formed using materials and methods such as wire mesh (e.g. copper), metal-mesh (e.g. copper, aluminium and silver), silver (or similar) "nanowires", carbon nanotubes/nanobuds, conductive polymers (example PEDOT), graphene and ITO or similar conductive inks (e.g. nanoparticles dispersed in solvent or other matrix).

There are different ways to build a sensor for the display device. Exemplary approaches are the following:

To build the sensor on Substrate 1 (300) in which case the sensor structure is integrated with this cover substrate, and Substrate 2 (200) would not be needed in the device structure. [According to this embodiment it is assumed that the colour filter is integrated with LCD/OLED substrate (100)].

To build the sensor on Substrate 2 (200), in which case sensor layers [i.e. the material coating layers 3 (310), 4 (330) and 5 (350) and conductive layers 2 (320) and 3 (340)] would be deposited and patterned on Substrate 2 (200) and Substrate 1 (300) would carry only the optional conductive layer 1 (301) and optional individual material coating layers 1 (302) and 2 (303) (the conductive layer 1 can have also on top or under additional oxide layer or other layer deposited by physical vapour deposition or liquid phase coating process).

To build the sensor layers on-top surface of the colour filter glass [i.e. the top substrate of the LCD/OLED substrate (100)], in which case Substrate 2 (200) would not be needed in the device structure and Substrate 1 (300) would carry only the optional conductive layer 1 (301) and optional individual material coating layers 1 (302) and 2 (303).

To integrate the sensor layers inside the LCD/OLED substrate (100), i.e. on the inner surface of the colour filter glass or on the LCD/OLED array glass, in which case Substrate 2 (200) would not be needed in the device structure and Substrate 1 (300) would carry only the optional conductive layer 1 (301) and optional individual material coating layers 1 (302) and 2 (303).

Figure 2:
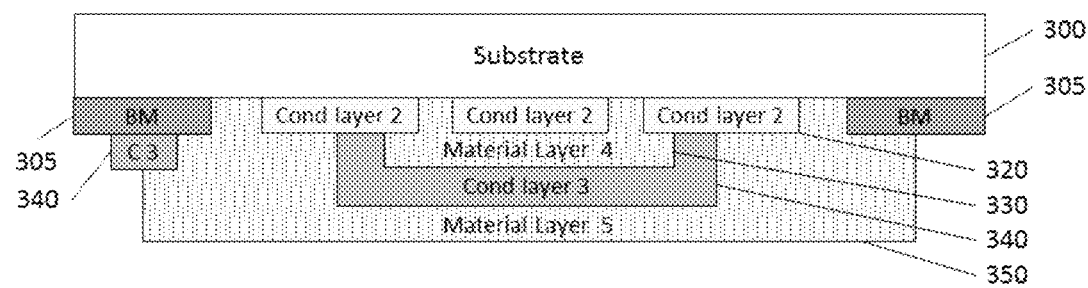
FIGS. 2-4 illustrate a cross-section of exemplary sensor structures.

FIG. 2 illustrates the cross-section of an exemplary sensor structure (layers shown not in scale in thickness or relative to each other). The substrate in the below example can be (300), (200) or (100) or combination of one or more depending on the approach chose to construct the device.

Figure 3:
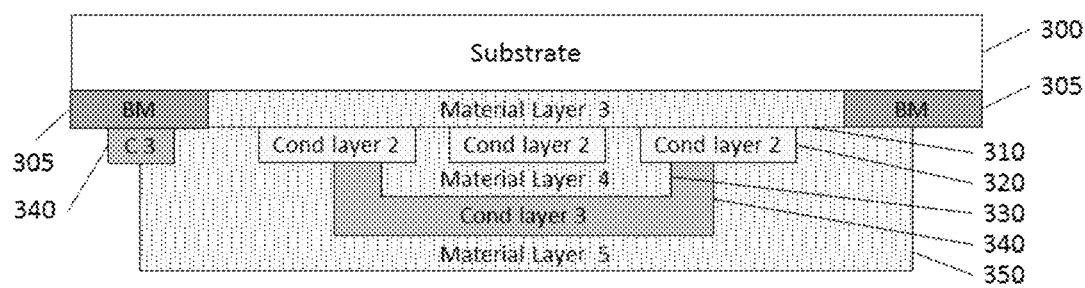

According to an exemplary embodiment, the sensor of FIG. 2 is put together in the following way:
1. Conductive layer (320), such as indium tin oxide (ITO) sputtered on a Substrate (300)
2. Conductive layer (320) patterned using lithography and wet etch
3. Black matrix (BM) (or optionally white matrix) material (305) deposited and patterned on substrate (or Material layer 4 (330) first)
4. Material layer 4 (330) deposited and patterned using lithography on substrate
5. Metal layers (Mo/Al/Mo, 340) deposited on the substrate
6. Metal layers (340) patterned using lithography and wet etch
7. Material layer 5 (350) deposited and patterned using lithography on substrate FIG. 3 illustrates a cross-section of an exemplary sensor structure wherein an optional material layer 3 (310) is used on a Substrate (300) in the sensor structure (layers shown not in scale in thickness or relative to each other). The substrate in the below example can be (300), (200) or (100) or combination of one or more depending on the approach chose to construct the device.

According to an exemplary embodiment, the sensor of FIG. 3 is put together in the following way:
1. Material layer 3 (310) deposited and optionally patterned using lithography on substrate (300) [or BM layer (305) first]
2. Conductive layer (320; ITO) sputtered on a substrate (300)
3. Conductive layer (320) patterned using lithography and wet etch
4. Black matrix (BM) (or optionally white matrix) material (305) deposited and patterned on substrate (300)
5. Material layer 4 (330) deposited and patterned using lithography on substrate (300)
6. Metal layers (Mo/Al/Mo, 340) deposited on the substrate (300)
7. Metal layers (340) patterned using lithography and wet etch
8. Material layer 5 (350) deposited and patterned using lithography on substrate (300)

Figure 4:
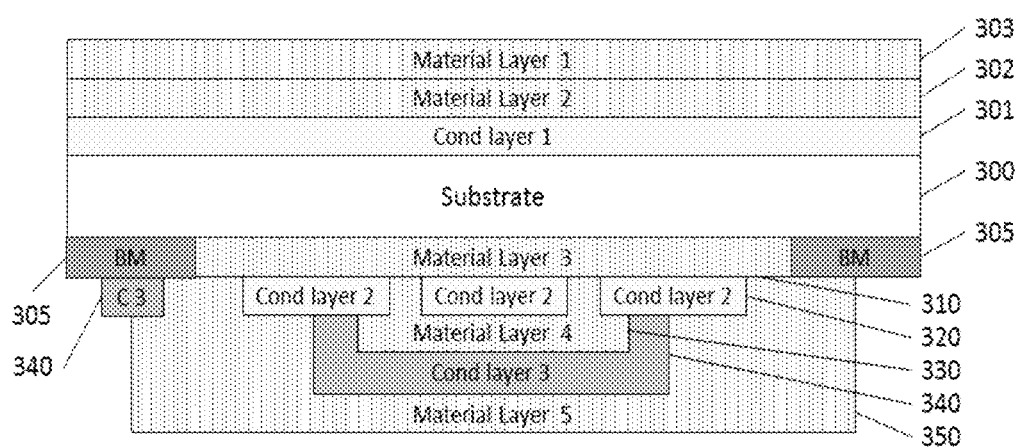

FIG. 4 illustrates a cross-section of an exemplary sensor wherein optional material layer 3 (310) is used on a Substrate (300) in the sensor structure. Furthermore, the picture illustrates the usage of the optional individual layers 301, 302 and 303 on opposite side the substrate 300 (layers shown not in scale in thickness or relative to each other). The substrate in the below example can be (300), (200) or (100) or combination of one or more depending on the approach chose to construct the device.

According to an exemplary embodiment, the sensor of FIG. 4 is put together the following way
1. Optional conductive layer 1 (301) deposited on a substrate (300) (conductive layer optionally patterned and optionally other functional layers deposited and optionally patterned)
2. Optional material layer 2 (302) deposited (and optionally lithographically patterned) on substrate (300)
3. Optional material layer 1 (303) deposited (and optionally lithographically patterned) on substrate (300)
4. Front layers is protected, followed by deposition of the rest of the layers on the opposite side of the substrate (300) (the sequence can be also performed the other way around, meaning performing below steps 5-12 first followed by above steps 1-3)
5. Optional material layers 3 (310) deposited and optionally patterned using lithography on substrate (300) [or BM layer (305) first]
6. Conductive layer (320; ITO) sputtered on a substrate (300)
7. Conductive layer (320) patterned using lithography and wet etch
8. Black matrix (BM) material (305) deposited and patterned on substrate (300)
9. Material layer 4 (330) deposited and patterned using lithography on substrate (300)
10. Metal layers (Mo/Al/Mo, 340) deposited on the substrate (300)
11. Metal layers (340) patterned using lithography and wet etch
12. Material layer 5 (350) deposited and patterned using lithography on substrate (300)

The material layers fulfill several requirements. Firstly, the material layer has good adhesion (requirement 4B-5B; ASTM D3359-09, Cross-Hatch tester) on multiple surfaces, e.g., on a substrate (e.g. glass or plastic), on any other polymer material (such as the black matrix material or white matrix material) and on conductive layers such as ITO and metals (molybdenum/aluminium/molybdenum).

Secondly, the material layer has good chemical resistivity against the wet etch chemicals, developers, solvents and strippers.

The chemical resistivity is verified typically again by adhesion test after chemical resistivity test (requirement 4B-5B; before and after; ASTM D3359-09, Cross-Hatch tester). The wet etchants are used during the lithographic patterning process steps of the conductive layers or other polymer layers. These etchants and strippers include KOH, potassium hydroxide (0.04%-7%); Aqua regia ($HNO_3$:HCl, typically in 1:3 ratio; 3.0N-9.0N); NaOH, (3-6%); TMAH, (0.2% 3%); Metal etchant [typical for Mo/Al/Mo; $H_3PO_4$: $HNO_3$:$CH_3COOH$, e.g. 55-70:5-9:4-8 (v/v/v)]; $FeCl_3$:HCl (20-25%:12-1614.5%, respectively); Oxalic acid (0.2%-2.5%); N-methyl-2-pyrrolidone; or other wet etchants, developers, solvents or strippers typically used in the lithography process.

The wet etch solutions are used at various temperatures (20° C.-80° C.) and at different concentrations depending on the actual layers to be etched and other layers already deposited on the substrate.

Thirdly, the material layer has good hardness (preferably over 4H or even over 6H; ASTM D3363-00, Elcometer tester).

In cases where the material layer is deposited directly on a substrate, which is already attached to the display substrate, the processing temperature is limited to max 150° C. or even to temperatures below 120° C. Typical curing time can be example 30 min at temperature. The material layer composition has to deliver all above properties at the low final cure temperature. The material can be of course used at higher final cure temperatures (e.g. 200° C. or 230° C. or higher), but it is specifically designed to deliver performance also at the low temperature.

EXAMPLES

Synthesis of a Coating Material

Example 1

Methyltriethoxysilane (203.4 g), phenyltrimethoxysilane (19.4 g), 3-methacryloxypropyltrimethoxysilane (13.5 g), glycidoxypropyltrimethoxysilane (138.9 g), 1,2-bis(triethoxysilyl)ethane (77.1 g) and acetone (405 g) were placed in a round bottom flask. 0.1 M aqueous HNO3 (115.8 g) was added, and the resulting mixture was refluxed for 2 h at 95° C. Solvent was changed from acetone to PGME. AIBN (3.6 g) was added, and the mixture was refluxed at 105° C. for 75 min. PGME (215 g) was added and all volatiles were removed in vacuum. The solid content was adjusted to 25% by adding PGME. PAG290 (2.6 g), BYK3700 (2.6 g) and UVS 1331 (0.64 g) were added. Finally, the mixture was filtrated using PALL filter (0.1 μm). The solution is ready to use for processing.

Example 2

Phenyltrimethoxysilane (8.08 g), methyltriethoxysilane (77 g), methacryloxypropyltrimethoxysilane (5.61 g), 3-glysidoxypropyltrimethoxysilane (57.83 g) and 1,2-bis(triethoxysilyl)ethane (48.2 g) were weighed to a round bottom flask. 2,4-diethyl-9H-thioxanthen-9-one (1.96 g) was weighed to the round bottom flask. 196 g of acetone was added to the round bottom flask. 53.51 g of water (0.1 M HNO3) was added to the reaction flask and the reaction mixture was refluxed at 95° C. for 2 hours. Solvent was changed from acetone to PGME (102 g added). After solvent exchange AIBN (1.63 g) was added to the material and the material solution was refluxed at 105° C. in an oil bath for 50 min. After reflux the solid content was adjusted to 25% by adding PGMEA. PAG290 (1% of solid polymer mass), BYK3700 (1% of solid polymer mass) and UVS1331 (0.25% of solid polymer mass) were added to material. After final filtration the solution is ready to use for processing. The material had a molecular weight (Mw) of 7500-8500.

Example 3

Phenyltrimethoxysilane (11.31 g), methyltriethoxysilane (107.8 g), methacryloxypropyltrimethoxysilane (7.85 g), 3-glycidoxypropyltrimethoxysilane (80.96 g) and 1,2-bis(triethoxysilyl)ethane (67.48 g) were weighed to a round bottom flask. 2-isopropyl-9H-thioxanthen-9-one, mixture of 2- and 4 isomers (2.74 g) was weighed to the round bottom flask. 278 g of acetone was added to the round bottom flask. 74.91 g of water (0.1 M HNO3) was added to the reaction flask and the reaction mixture was refluxed at 95° C. for 2 hours. Solvent was changed from acetone to PGME (138 g added). After solvent exchange AIBN (2.28 g) was added to the material and the material solution was refluxed at 105° C. in an oil bath for 60 min. After reflux the solid content was adjusted to 25% by adding PGMEA. PAG290 (1% of solid polymer mass), BYK3700 (1% of solid polymer mass) and UVS1331 (0.25% of solid polymer mass) were added to material. After final filtration the solution is ready to use for processing. The material had a molecular weight (Mw) of 9300.

Example 4

Phenyltrimethoxysilane (11.31 g), methyltriethoxysilane (107.8 g), methacryloxypropyltrimethoxysilane (7.85 g), 3-glycidoxypropyl-trimethoxysilane (80.96 g) and 1,2-bis(triethoxysilyl)ethane (67.48 g) were weighed to a round bottom flask. 1-chloro-4-propoxy-9H-thioxanthen-9-one (2.74 g) was weighed to the round bottom flask. 278 g of acetone was added to the round bottom flask. 74.91 g of water (0.1 M HNO3) was added to the reaction flask and the reaction mixture was refluxed at 95° C. in an oil bath for 2 hours. Solvent was changed from acetone to PGME (138 g added). After solvent exchange AIBN (2.19 g) was added to the material and the material solution was refluxed at 105° C. in an oil bath for 60 min. After reflux the solid content was adjusted to 25% by adding PGMEA. PAG290 (1% of solid polymer mass), BYK3700 (1% of solid polymer mass) and UVS1331 (0.25% of solid polymer mass) were added to material. After final filtration the solution is ready to use for processing. The material had a molecular weight (Mw) of 8000.

Example 5

Diphenylsilanediol (13.72 g), phenyltrimethoxysilane (11.31 g), methyltriethoxysilane (107.8 g), methacryloxypropyltrimethoxysilane (7.85 g), 3-glycidoxypropyl-trimethoxysilane (80.96 g) and 1,2-bis(triethoxysilyl)ethane (67.48 g) were weighed to a round bottom flask. 274 g of acetone was added to the round bottom flask. 74.91 g of water (0.1 M HNO3) was added to the reaction flask and the reaction mixture was refluxed at 95° C. in an oil bath for 2 hours. Solvent was changed from acetone to PGME (141 g added). After solvent exchange AIBN (2.31 g) was added to the material and the material solution was refluxed at 105° C. in an oil bath for 80 min. After reflux the solid content was adjusted to 25% by adding PGMEA. PAG290 (1% of solid polymer mass), BYK3700 (1% of solid polymer mass) and UVS1331 (0.25% of solid polymer mass) were added to material. After final filtration the solution is ready to use for processing. The material had a molecular weight (Mw) of 9600.

Example 6

Phenyltrimethoxysilane (11.31 g), methyltriethoxysilane (107.8 g), methacryloxypropyltrimethoxysilane (7.86 g), 3-glycidoxypropyl-trimethoxysilane (80.96 g), 1,2-bis(triethoxysilyl)ethane (44.98 g) and 1,2-bis(trimethoxysilyl)

ethane (17.15 g) were weighed to a round bottom flask. 268.8 g of acetone was added to the round bottom flask. 74.92 g of water (0.1 M HNO3) was added to the reaction flask and the reaction mixture was refluxed at 95° C. in an oil bath for 2 hours. Solvent was changed from acetone to PGME (143 g added). After solvent exchange AIBN (2.12 g) was added to the material and the material solution was refluxed at 105° C. in an oil bath for 45 min. After reflux the solid content was adjusted to 25% by adding PGMEA. PAG290 (1% of solid polymer mass), BYK3700 (1% of solid polymer mass) and UVS1331 (0.25% of solid polymer mass) were added to material. After final filtration the solution is ready to use for processing. The material had a molecular weight (Mw) of 9300.

Example 7

Phenyltrimethoxysilane (8.08 g), Methyltriethoxysilane (72.45 g), Methacryloxypropyltrimethoxysilane (5.62 g), 3-glysidoxypropyl-trimethoxysilane (57.83 g), 1,2-Bis(triethoxysilyl)ethane (48.2 g) and 1,2-Bis(trimethoxysilyl)ethane (7.35 g) were weighed to a round bottom flask. 199.5 g of acetone was added to the round bottom flask. 54.9 g of water (0.1 M HNO3) was added to the reaction flask and the reaction mixture was refluxed at 95° C. in an oil bath for 2 hours. Solvent was changed from acetone to PGME (109 g added). After solvent exchange AIBN (1.52 g) was added to the material and the material solution was refluxed at 105° C. in an oil bath for 50 min. After reflux the solid content was adjusted to 25% by adding PGMEA. PAG290 (1% of solid polymer mass), BYK3700 (1% of solid polymer mass) and UVS1331 (0.25% of solid polymer mass) were added to material. After final filtration the solution is ready to use for processing. The material had a molecular weight (Mw) of 8100.

Example 8

Phenyltrimethoxysilane (8.08 g), Methyltriethoxysilane (72.45 g), Methacryloxypropyltrimethoxysilane (5.62 g), 3-glysidoxypropyl-trimethoxysilane (57.83 g), 1,2-Bis(triethoxysilyl)ethane (48.2 g) and 1,2-Bis(trimethoxysilyl)ethane (9.35 g) were weighed to a round bottom flask. 199.5 g of acetone was added to the round bottom flask. 54.9 g of water (0.1 M HNO3) was added to the reaction flask and the reaction mixture was refluxed at 95° C. in an oil bath for 2 hours. Solvent was changed from acetone to MIBK (109 g added). After solvent exchange AIBN (1.52 g) was added to the material and the material solution was refluxed at 105° C. in an oil bath for 60 min. After reflux the solid content was adjusted to 25% by adding PGMEA. PAG290 (1% of solid polymer mass), BYK3700 (1% of solid polymer mass) and UVS1331 (0.25% of solid polymer mass) were added to material. After final filtration the solution is ready to use for processing. The material had a molecular weight (Mw) of 8000-10 000.

Example 9

Phenyltrimethoxysilane (8.08 g), Methyltriethoxysilane (77.02 g), Methacryloxypropyltrimethoxysilane (5.62 g), 3-glysidoxypropyl-trimethoxysilane (57.83 g), 1,2-Bis(triethoxysilyl)ethane (35.98 g) and 1,2-Bis(trimethoxysilyl)ethane (9.3 g) were weighed to a round bottom flask. 193.8 g of acetone was added to the round bottom flask. 51.73 g of water (0.1 M HNO3) was added to the reaction flask and the reaction mixture was refluxed at 95° C. in an oil bath for 2 hours. Solvent was changed from acetone to PGME (104 g added). After solvent exchange AIBN (1.52 g) was added to the material and the material solution was refluxed at 105° C. in an oil bath for 50 min. After reflux the solid content was adjusted to 25% by adding PGMEA. PAG290 (1% of solid polymer mass), BYK3700 (1% of solid polymer mass) and UVS1331 (0.25% of solid polymer mass) were added to material. After final filtration the solution is ready to use for processing. The material had a molecular weight (Mw) of 8500.

Example 10

Phenyltrimethoxysilane (8.08 g), Methyltriethoxysilane (77.02 g), Methacryloxypropyltrimethoxysilane (5.62 g), 3-glysidoxypropyl-trimethoxysilane (57.83 g), 1,2-Bis(triethoxysilyl)ethane (35.98 g) and 1,2-Bis(trimethoxysilyl)ethane (9.3 g) were weighed to a round bottom flask. 193.8 g of acetone was added to the round bottom flask. 51.73 g of water (0.1 M HNO3) was added to the reaction flask and the reaction mixture was refluxed at 95° C. in an oil bath for 2 hours. Solvent was changed from acetone to MIBK (104 g added). After solvent exchange AIBN (1.77 g) was added to the material and the material solution was refluxed at 105° C. in an oil bath for 45 min. After reflux the solid content was adjusted to 25% by adding PGMEA. PAG290 (1% of solid polymer mass), BYK3700 (1% of solid polymer mass) and UVS1331 (0.25% of solid polymer mass) were added to material. After final filtration the solution is ready to use for processing. The material had a molecular weight (Mw) of 6000-8000.

Example 11

Phenyltrimethoxysilane (8.08 g), Methyltriethoxysilane (77 g), Methacryloxypropyltriethoxysilane (9.19 g), 3-glysidoxypropyl-trimethoxysilane (57.83 g) and 1,2-Bis(triethoxysilyl)ethane (48.18 g) were weighed to a round bottom flask. 196.7 g of acetone was added to the round bottom flask. 53.49 g of water (0.1 M HNO3) was added to the reaction flask and the reaction mixture was refluxed at 95° C. for 2 hours. Solvent was changed from acetone to PGME (104 g added). After solvent exchange AIBN (1.65 g) was added to the material and the material solution was refluxed at 105° C. in an oil bath for 75 min. After reflux the solid content was adjusted to 25% by adding PGMEA. PAG290 (1% of solid polymer mass), BYK3700 (1% of solid polymer mass) and UVS1331 (0.25% of solid polymer mass) were added to material. After final filtration the solution is ready to use for processing. The material had a molecular weight (Mw) of 9500.

Example 12

Phenyltrimethoxysilane (11.31 g), methyltriethoxysilane (107.83 g), methacryloxypropyltrimethoxysilane (7.85 g), 3-glycidoxypropyl-trimethoxysilane (80.96 g) and 1,2-bis(triethoxysilyl)ethane (67.48 g) were weighed to a round bottom flask. 268.8 g of acetone was added to the round bottom flask. 74.92 g of water (0.1 M HNO3) was added to the reaction flask and the reaction mixture was refluxed at 95° C. for 2 hours. Solvent was changed from acetone to methyl isobutyl ketone (MIBK) (143 g added). After solvent exchange AIBN (2.26 g) was added to the material and the material solution was refluxed at 105° C. for 50 min. After reflux the solid content was adjusted to 25% by adding PGMEA. PAG290 (1% of solid polymer mass), BYK3700

(1% of solid polymer mass) and UVS1331 (0.25% of solid polymer mass) were added to material. After final filtration the solution is ready to use for processing. The material had a molecular weight (Mw) of 10000.

Example 13

Phenyltrimethoxysilane (28.3 g), methyltriethoxysilane (296.6 g), methacryloxypropyltrimethoxysilane (19.7 g), 3-glycidoxypropyl-trimethoxysilane (202.6 g) and 1,2-bis(triethoxysilyl)ethane (112.4 g) were weighed to round bottom flask. 659 g of acetone was added to the reactor. 179 g of water (0.1 M HNO3) was added to the reaction flask and the reaction mixture was refluxed at 95° C. in an oil bath for 2 hours. Solvent was changed from acetone to PGME (379 g added). After solvent exchange AIBN (4.21 g, 1.4 m % out of the siloxane polymer solids) was added to the material and the material solution was refluxed at 105° C. in an oil bath for 60 min. After reflux the solid content was adjusted to 25% by adding PGMEA. PAG290 (1% of solid polymer mass), BYK3700 (1% of solid polymer mass) and UVS1101 (0.25% of solid polymer mass) were added to material. After final filtration the solution is ready to use for processing. The material had a molecular weight (Mw) of 17000.

Example 14

Phenyltrimethoxysilane (28.3 g), methyltriethoxysilane (296.6 g), methacryloxypropyltrimethoxysilane (19.7 g), 3-glycidoxypropyl-trimethoxysilane (202.6 g) and 1,2-bis(triethoxysilyl)ethane (112.4 g) were weighed to round bottom flask. 659 g of acetone was added to the reactor. 179 g of water (0.1 M HNO3) was added to the reaction flask and the reaction mixture was refluxed at 95° C. in an oil bath for 2 hours. Solvent was changed from acetone to PGME (379 g added). After solvent exchange AIBN (4.02 g, 1.4 m % out of the siloxane polymer solids) was added to the material and the material solution was refluxed at 105° C. in an oil bath for 40 min. After reflux the solid content was adjusted to 25% by adding PGMEA. PAG290 (1% of solid polymer mass), BYK3700 (1% of solid polymer mass) and UVS1101 (0.25% of solid polymer mass) were added to material. After final filtration the solution is ready to use for processing. The material had a molecular weight (Mw) of 13000.

Example 15

Phenyltrimethoxysilane (28.3 g), methyltriethoxysilane (296.6 g), methacryloxypropyltrimethoxysilane (19.7 g), 3-glycidoxypropyl-trimethoxysilane (202.6 g) and 1,2-bis(triethoxysilyl)ethane (112.4 g) were weighed to round bottom flask. 659 g of acetone was added to the reactor. 179 g of water (0.1 M HNO3) was added to the reaction flask and the reaction mixture was refluxed at 95° C. in an oil bath for 2 hours. Solvent was changed from acetone to PGME (379 g added). After solvent exchange AIBN (4.17 g, 1.4 m % out of the siloxane polymer solids) was added to the material and the material solution was refluxed at 105° C. in an oil bath for 25 min. After reflux the solid content was adjusted to 25% by adding PGMEA. PAG290 (1% of solid polymer mass), BYK3700 (1% of solid polymer mass) and UVS1101 (0.25% of solid polymer mass) were added to material. After final filtration the solution is ready to use for processing. The material had a molecular weight (Mw) of 8500.

Example 16

Phenyltrimethoxysilane (8.08 g), methyltriethoxysilane (72.45 g), methacryloxypropyltrimethoxysilane (5.62 g), 3-glycidoxypropyl-trimethoxysilane (57.83 g), 1,2-bis(triethoxysilyl)ethane (48.21 g) and 1-(2-(trimethoxysilyl)ethyl)cyclohexane-3,4-epoxide (6.69 g) were weighed to a round bottom flask. 198.88 g of acetone was added to the round bottom flask. 46.53 g of water (0.1 M HNO3) was added to the reaction flask and the reaction mixture was refluxed at 95° C. in an oil bath for 2 hours. Solvent was changed from acetone to PGME (104 g added). After solvent exchange AIBN (1.59 g) was added to the material and the material solution was refluxed at 105° C. in an oil bath for 55 min. After reflux the solid content was adjusted to 25% by adding PGMEA. PAG290 (1% of solid polymer mass), BYK3700 (1% of solid polymer mass) and UVS1331 (0.25% of solid polymer mass) were added to material. After final filtration the solution is ready to use for processing. The material had a molecular weight (Mw) of 8500.

Example 17

Phenyltrimethoxysilane (8.08 g), Methyltriethoxysilane (77.0 g), Methacryloxypropyltrimethoxysilane (5.62 g), 3-glycidoxypropyl-trimethoxysilane (57.83 g) and 1,2-Bis(trimethoxysilyl)ethane (36.75 g) were weighed to a round bottom flask. 185.0 g of acetone was added to the round bottom flask. 53.49 g of water (0.1 M HNO3) was added to the reaction flask and the reaction mixture was refluxed at 95° C. in an oil bath for 2 hours. Solvent was changed from acetone to PGME (104 g added). After solvent exchange AIBN (1.54 g) was added to the material and the material solution was refluxed at 105° C. in an oil bath for 55 min. After reflux the solid content was adjusted to 25% by adding PGMEA. PAG290 (1% of solid polymer mass), BYK3700 (1% of solid polymer mass) and UVS1331 (0.25% of solid polymer mass) were added to material. After final filtration the solution is ready to use for processing. The material had a molecular weight (Mw) of 6600.

Example 18

Phenyltrimethoxysilane (8.08 g), methyltriethoxysilane (75.5 g), methacryloxypropyltrimethoxysilane (5.62 g), 3-glycidoxypropyl-trimethoxysilane (57.83 g), 1,2-bis(triethoxysilyl)ethane (48.2 g) and 1H, 1H, 2H, 2H-Perfluorodecyltrimethoxysilane (5.15 g) were weighed to a round bottom flask. 200.38 g of acetone was added to the round bottom flask. 41.57 g of water (0.1 M HNO3) was added to the reaction flask and the reaction mixture was refluxed at 95° C. in an oil bath for 2 hours. Solvent was changed from acetone to MIBK (103 g added). After solvent exchange AIBN (1.84 g) was added to the material and the material solution was refluxed at 105° C. in an oil bath for 55 min. After reflux the solid content was adjusted to 25% by adding PGMEA. PAG290 (1% of solid polymer mass), BYK3700 (1% of solid polymer mass) and UVS1331 (0.25% of solid polymer mass) were added to material. After final filtration the solution is ready to use for processing. The material had a molecular weight (Mw) of 8800.

Example 19

Phenyltrimethoxysilane (4.48 g), tetraethoxysilane (17.43 g), dimethyldimethoxysilane (5.03 g), methyltriethoxysilane (50.0 g), methacryloxypropyltrimethoxysilane (5.19 g), 3-glycidoxypropyl-trimethoxysilane (53.4 g) and 1,2-bis(triethoxysilyl)ethane (80.13 g) were weighed to a round bottom flask. 215.66 g of acetone was added to the round bottom flask. 59.59 g of water (0.1 M HNO3) was added to the reaction flask and the reaction mixture was refluxed at 95° C. in an oil bath for 2 hours. Solvent was changed from acetone to MIBK (103 g added). After solvent exchange AIBN (1.71 g) was added to the material and the material solution was refluxed at 105° C. in an oil bath for 35 min. After reflux the solid content was adjusted to 25% by adding PGMEA. PAG290 (1% of solid polymer mass), BYK3700 (1% of solid polymer mass) and UVS1331 (0.25% of solid polymer mass) were added to material. After final filtration the solution is ready to use for processing. The material had a molecular weight (Mw) of 23400.

Example 20

Phenyltrimethoxysilane (4.41 g), methyltriethoxysilane (70 g), glycidylmethacrylate (2.93 g), 3-glycidoxypropylt-rimethoxysilane (52.56 g) and 1,2-bis(triethoxysilyl)ethane (49.65 g) were weighed to a round bottom flask. 179.55 g of acetone was added to a round bottom flask. 46.21 g of water (0.1 M HNO3) was added to the reaction flask and the reaction mixture was refluxed at 95° C. in an oil bath for 2 hours. Solvent was changed from acetone to PGME (102 g added). After solvent exchange AIBN (1.68 g) was added to the material and the material solution was refluxed at 105° C. in an oil bath for 120 min. After reflux the solid content was adjusted to 25% by adding PGMEA. PAG290 (1% of solid polymer mass), BYK3700 (1% of solid polymer mass) and UVS1331 (0.25% of solid polymer mass) were added to material. After final filtration the solution is ready to use for processing. The material had a molecular weight (Mw) of 6100.

Example 21

Phenyltrimethoxysilane (32.26 g), Methyltriethoxysilane (54.05 g), Methacryloxypropyltrimethoxysilane (5.61 g), 3-glysidoxypropyl-trimethoxysilane (57.74 g) and 1,2-Bis(triethoxysilyl)ethane (32.08 g) were weighed to a round bottom flask. 192 g of acetone was added to the round bottom flask. 48.77 g of water (0.1 M HNO3) was added to the reaction flask and the reaction mixture was refluxed at 95° C. in an oil bath for 2 hours. Solvent was changed from acetone to PGME (94 g added). After solvent exchange AIBN (1.72 g) was added to the material and the material solution was refluxed at 105° C. in an oil bath for 85 min. After reflux the solid content was adjusted to 18% by adding PGME:MEK (methyl ethyl ketone) so that ratio of solvents is 90:10 respectively. PAG290 (1% of solid polymer mass), BYK3700 (1% of solid polymer mass) and UVS1331 (0.25% of solid polymer mass) were added to material. After final filtration the solution is ready to use for processing. The material had a molecular weight (Mw) of 7000.

Example Process for Coating Deposition and Patterning on a Substrate:

1. Substrate pre-clean (Substrate can contain ITO, metal, glass, black matrix or white matrix or polymer surface exposed to the coating layer): Potassium hydroxide (KOH) pre-clean (the KOH solution can be at room temperature or temperature can be varied between 20° C.-55° C.; typical concentration can be varied from 0.04% to 1%) followed by deionized water rinse followed by a drying process. Alternatively adhesion promoters, primers or other chemical or physical surface modification methods can be used to improve wetting and adhesion.

2. Material deposition: Coating material is deposited on a substrate by using slot coating, combined slot+spin coating, spin coating, spray coating, ink-jet printing, curtain coating, roller, roll-to-roll, printing (to mention few typical liquid phase deposition methods). The formulation (solvent(s)+additives) is adjusted the way that a proper coating thickness, uniformity and planarization/conformality (to mention few typical requirements) of the coating are achieved.

3. Vacuum dry and/or pre-bake: After deposition the substrate is transferred to a vacuum dry station and/or pre-bake on a hot-plate (or oven) usually at 70-120° C. for 1-3 minutes. In this step major portion of the formulation solvent is removed and substrate is left with a pre cured (dry or slightly tacky) film ready for further processing.

4. Exposure: in a standard photolithography process, a photomask or reticle is used with broadband, g-,h-,i-line or i-line exposure. Typical UV exposure dose required is 50-200 mj (or above) by using g-,h-,i-line exposure. In case no patterning is required for the deposited layer or the patterning is done by other means a full substrate area exposure can be used (without using any photomask or reticle). It is also possible to use so called wait step or post exposure bake step to improve exposed region curing. The material described in the current invention functions as a negative tone resist meaning the areas what are exposed polymerize under UV light (making the exposed areas less soluble to a developer). It is possible to reverse the material to be positive tone (making the exposed areas to be more soluble to the developer solution) with special additives. It is also possible to use the material as thermal cure formulation without using the UV-exposure in case no patterning is needed. In this case thermal initiators can be applied.

5. Development: in the development step the more soluble regions of the film (see above) are dissolved by the developer solution. The less soluble regions (exposed areas in case of negative tone material) remain on the substrate after development. So called spray development or a buddle development methods can be used. The developer solvent can be at room temperature or temperature can be varied between 20-55° C. Typical developers include potassium hydroxide (KOH) and tetra methyl ammonium hydroxide (TMAH), but is not limited to these. Typical concentrations are e.g. 0.04%-0.7% for KOH and 0.2%-2.38% for TMAH. The application of the developer solution is followed by a deionized or standard water rinse spray or buddle. As a final step, water is dried off by air knife/blow and/or heating (blow or IR-cure, hot-plate or oven).

6. Final cure: depending on the used substrate and other coating material layers the material is cured in convection oven, by IR-lamp cure, forced air cure at 80-300° C. Also specifically in a cases where the material layer is deposited directly on a substrate, which is already attached to the display substrate the processing temperature is limited to max 150° C. or even to temperatures below 120° C. Typical curing time can be example 30 min at temperature. The material layer composition has to deliver all above properties at the low final cure temperature. The material can be used at higher final cure temperatures (e.g. 200° C. or 230° C. or higher), but it is specifically designed to deliver performance also at the low temperature.

The results are shown in Table 1; the abbreviation "BTSE" stands for bis(triethoxysilyl)ethane.

TABLE 1

|  | Comparative (without BTSE) | | | Example 1 | | | Example 2 | | | Example 6 | | |
| --- | --- | --- | --- | --- | --- | --- | --- | --- | --- | --- | --- | --- |
| Substrate pre-clean | Spray clean KOH and Deionized water | | | Spray clean KOH and Deionized water | | | Spray clean KOH and Deionized water | | | Spray clean KOH and Deionized water | | |
| Coating method | Spin coating | | | Spin coating | | | Spin coating | | | Spin coating | | |
| Pre-cure (Hotplate) | 120° C. 60 s | | | 100° C. 60 s | | | 100° C. 60 s | | | 100° C. 60 s | | |
| Exposure (ml; g-; h- and i-line) | 200 ml | | | 200 ml | | | 200 ml | | | 200 ml | | |
| Post Exposure Bake (Hotplate) | 120° C. 10 s | | | Not required | | | Not required | | | Not required | | |
| Developer (Spray develop) | KOH 0.045% | | | KOH 0.045% | | | KOH 0.045% | | | KOH 0.045% | | |
| Post-cure (convection oven) | 120° C. 30 min | 150° C. 30 min | 230° C. 30 min | 120° C. 30 min | 150° C. 30 min | 230° C. 30 min | 120° C. 30 min | 150° C. 30 min | 230° C. 30 min | 120° C. 30 min | 150° C. 30 min | 230° C. 30 min |
| Film thickness | 1.65 μm | | | 1.65 μm | | | 1.65 μm | | | 1.65 μm | | |
| Pencil Hardness | 4H | 4H | 5H | 5H | 5H | 7H | 5H | 6H | 7H | 6H | 6H | 8H |
| Transmission 400-800 nm | >99.5% | >99.5% | >99.5% | >99.5% | >99.5% | >99.5% | >99.5% | >99.5% | >99.5% | >99.5% | >99.5% | >99.5% |
| Transmission at 400 nm | >98.5% | >98.5% | >98.5% | >98.5% | >98.5% | >98.5% | >98.5% | >98.5% | >98.5% | >98.5% | >98.5% | >98.5% |
| Adhesion (after post cure) Glass | 5B | 5B | 5B | 5B | 5B | 5B | 5B | 5B | 5B | 5B | 5B | 5B |
| ITO glass | 4B | 4B | 5B | 5B | 5B | 5B | 5B | 5B | 5B | 5B | 5B | 5B |
| BM | 5B | 5B | 5B | 5B | 5B | 5B | 5B | 5B | 5B | 5B | 5B | 5B |
| Mo/Al/Mo glass | 4B | 4B | 5B | 5B | 5B | 5B | 5B | 5B | 5B | 5B | 5B | 5B |
| Chemical Resistance (followed by adhesion test on ITO glass) 47° C., 240 s, FeCl3 23% + HCl 14.5% | 0B | 0B | 3-4B | 3B | 4B | 5B | 4B | 5B | 5B | 4B | 5B | 5B |
| 30° C., 150 s, H3PO4:HNO3:CH3COOH; 64.5:6.8:5 (wt %) | 0B | 0B | 3-4B | 4B | 5B | 5B | 4B | 5B | 5B | 5B | 5B | 4B |
| RT° C., 150 s, H3PO4:HNO3:CH3COOH; 64.5; 6.8:5 (wt %) | 0B | 0B | 3-4B | 5B | 5B | 5B | 5B | 5B | 4B | 5B | 5B | 5B |

Measurements:
Film thickness: Ellipsometer
Pencil Hardness: ASTM D3363-00, Elcometer tester
Transmission: Spectrophometer
Adhesion: ASTM D3359-09, Cross-Hatch tester

Example 22

"Methyltriethoxysilane (84.7 g), Phenyltrimethoxysilane (8.08 g), Methacryloxypropyltrimethoxysilane (5.62 g), 3-glycidoxypropyltrimethoxysilane (57.89 g), 1,2-Bis(triethoxysilyl)ethane (32.11 g) were weighed to a round bottom flask. 188 g of acetone was added to the round bottom flask. 51.57 g of water (0.1 M HNO3) was added to the reaction flask and the reaction mixture was refluxed at 95° C. oil bath for 2 hours. Solvent was changed from acetone to PGME (109 g added). After solvent exchange AIBN (1.4 m % out of the siloxane polymer solids) was added to the material and the material solution was refluxed at 105° C. in an oil bath for 25 min. After reflux the solid content was adjusted to 25% by adding PGME. PAG290 (1% of solid polymer mass), UVI6976 (2% of solid polymer mass), BYK3700 (1% of solid polymer mass) and UVS1101 (0.5% of solid polymer mass) were added to material. After final filtration the solution is ready to use for processing. The material had a molecular weight ($M_w$) of 14850.

Example 23

Phenyltrimethoxysilane (8.08 g), Methyltriethoxysilane (77.02 g), Methacryloxypropyltrimethoxysilane (5.62 g), 3-glysidoxypropyl-trimethoxysilane (57.83 g), 1,2-Bis(triethoxysilyl)ethane (35.98 g) and 1,2-Bis(trimethoxysilyl)ethane (9.3 g) were weighed to a round bottom flask. 193.8 g of acetone was added to the round bottom flask. 51.73 g of water (0.1 M HNO3) was added to the reaction flask and the reaction mixture was refluxed at 95° C. in an oil bath for 2 hours. Solvent was changed from acetone to MIBK (104 g added). After solvent exchange AIBN (1.77 g) was added to the material and the material solution was refluxed at 105° C. in an oil bath for 45 min. After reflux the solid content was adjusted to 25% by adding PGMEA. PAG290 (2% of solid polymer mass), UVI6976 (2% of solid polymer mass), BYK3700 (1% of solid polymer mass) and UVS1101 (0.5% of solid polymer mass) were added to material. After final filtration the solution is ready to use for processing. The material had a molecular weight (Mw) of 8500.

Example 24

Phenyltrimethoxysilane (8.08 g), Methyltriethoxysilane (77.02 g), Methacryloxypropyltrimethoxysilane (5.62 g), 3-glysidoxypropyl-trimethoxysilane (57.83 g), 1,2-Bis(triethoxysilyl)ethane (35.98 g) and 1,2-Bis(trimethoxysilyl)ethane (9.3 g) were weighed to a round bottom flask. 193.8 g of acetone was added to the round bottom flask. 51.73 g of water (0.1 M HNO3) was added to the reaction flask and the reaction mixture was refluxed at 95° C. in an oil bath for 2 hours. Solvent was changed from acetone to PGME (104 g added). After solvent exchange AIBN (1.77 g) was added to the material and the material solution was refluxed at 105° C. in an oil bath for 45 min. After reflux the solid content was adjusted to 25% by adding PGMEA. PAG290 (1% of solid polymer mass), UVI6976 (2% of solid polymer mass), BYK3700 (1% of solid polymer mass) and UVS1101 (0.5% of solid polymer mass) were added to material. After final filtration the solution is ready to use for processing. The material had a molecular weight (Mw) of 8500.

Example 25

Dimethyldiethoxysilane (18.72 g), Phenylmethyldimethoxysilane (4.46 g), Methacryloxypropyltrimethoxysilane (3.1 g), 3-glycidoxypropyl-trimethoxysilane (31.9 g), 1,2-Bis(triethoxysilyl)ethane (17.7 g) were weighed to a round bottom flask. 75.98 g of acetone was added to the round bottom flask. 18.81 g of water (0.1 M HNO3) was added to the reaction flask and the reaction mixture was refluxed at 95° C. in an oil bath for 2 hours. Solvent was changed from acetone to PGME (50 g added). After solvent exchange AIBN (1.4 m % out of the siloxane polymer solids) was added to the material and the material solution was refluxed at 105° C. in an oil bath for 120 min. After reflux the solid content was adjusted to 25% by adding PGMEA. PAG290 (1% of solid polymer mass), UVI6976 (2% of solid polymer mass), BYK3700 (1% of solid polymer mass) and UVS1101 (0.5% of solid polymer mass) were added to material.

Example 26

Methyltriethoxysilane (42.49 g Phenylmethyldimethoxysilane (4.56 g), Methacryloxypropyltrimethoxysilane (3.1 g), 3-Glycidoxypropyl)methyldimethoxysilane (31.9 g), 1,2-Bis(triethoxysilyl)ethane (17.7 g) were weighed to a round bottom flask. 100 g of acetone was added to the round bottom flask. 27.9 g of water (0.1 M HNO3) was added to the reaction flask and the reaction mixture was refluxed at 95° C. in an oil bath for 2 hours. Solvent was changed from acetone to PGME (50 g added). After solvent exchange AIBN (1.4 m % out of the siloxane polymer solids) was added to the material and the material solution was refluxed at 105° C. in an oil bath for 90 min. After reflux the solid content was adjusted to 25% by adding PGMEA. PAG290 (1% of solid polymer mass), UVI6976 (2% of solid polymer mass), BYK3700 (1% of solid polymer mass) and UVS1101 (0.5% of solid polymer mass) were added to material. After final filtration the solution is ready to use for processing. The material had a molecular weight ($M_w$) of 9004.

Example 27

Methyltriethoxysilane (42.35 g), Phenyltrimethoxysilane (4.01 g), Methacryloxypropyltrimethoxysilane (2.79 g), 3-Glycidoxypropyl)methyldimethoxysilane (28.71 g), 1,2-Bis(triethoxysilyl)methane (15.32 g) were weighed to a round bottom flask. 93 g of acetone was added to the round bottom flask. 26.71 g of water (0.1 M HNO3) was added to the reaction flask and the reaction mixture was refluxed at 95° C. in an oil bath for 2 hours. Solvent was changed from acetone to PGME (50 g added). After solvent exchange AIBN (1.4 m % out of the siloxane polymer solids) was added to the material and the material solution was refluxed at 105° C. in an oil bath for 50 min. After reflux the solid content was adjusted to 25% by adding PGMEA. PAG290 (1% of solid polymer mass), UVI6976 (2% of solid polymer mass), BYK3700 (1% of solid polymer mass) and UVS1101 (0.25% of solid polymer mass) were added to material. After final filtration the solution is ready to use for processing. The material had a molecular weight ($M_w$) of 11500.

Example 28

Dimethyldiethoxysilane (20.57 g), Phenyltrimethoxysilane (4.45 g), Methacryloxypropyltrimethoxysilane (3.1 g), 3-glycidoxypropyl-trimethoxysilane (31.9 g), 1,2-Bis(triethoxysilyl)ethane (17.7 g) were weighed to a round bottom flask. 77.73 g of acetone was added to the round bottom flask. 17.01 g of water (0.1 M HNO3) was added to the reaction flask and the reaction mixture was refluxed at 95° C. in an oil bath for 2 hours. Solvent was changed from acetone to PGME (50 g added). After solvent exchange AIBN (1.4 m % out of the siloxane polymer solids) was added to the material and the material solution was refluxed at 105° C. in an oil bath for 120 min. After reflux the solid content was adjusted to 25% by adding PGMEA. PAG290 (1% of solid polymer mass), UVI6976 (2% of solid polymer mass), BYK3700 (1% of solid polymer mass) and UVS1101 (0.25% of solid polymer mass) were added to material. After final filtration the solution is ready to use for processing. The material had a molecular weight ($M_w$) of 8362.

Example 29

Methyltriethoxysilane (23.98 g), Phenyltrimethoxysilane (4.45 g), Methacryloxypropyltrimethoxysilane (3.1 g), 3-Glycidoxypropyl)methyldimethoxysilane (29.71 g), 1,2-Bis(triethoxysilyl)ethane (17.7 g) were weighed to a round bottom flask. 78.79 g of acetone was added to the round bottom flask. 19.98 g of water (0.1 M HNO3) was added to the reaction flask and the reaction mixture was refluxed at 95° C. in an oil bath for 2 hours. Solvent was changed from acetone to PGME (50 g added). After solvent exchange AIBN (1.4 m % out of the siloxane polymer solids) was added to the material and the material solution was refluxed at 105° C. in an oil bath for 120 min. After reflux the solid content was adjusted to 25% by adding PGMEA. PAG290 (1% of solid polymer mass), UVI6976 (2% of solid polymer mass), BYK3700 (1% of solid polymer mass) and UVS1101 (0.25% of solid polymer mass) were added to material. After final filtration the solution is ready to use for processing. The material had a molecular weight ($M_w$) of 4500.

Example 30

Dimethyldiethoxysilane (18.72 g), Phenylmethyldimethoxysilane (4.56 g), Methacryloxypropyltrimethoxysilane (3.1 g), 3-Glycidoxypropyl)methyldimethoxysilane (31.9 g), 1,2-Bis(triethoxysilyl)ethane (17.7 g) were weighed to a round bottom flask. 79 g of acetone was added to the round bottom flask. 18.81 g of water (0.1 M HNO3) was added to the reaction flask and the reaction mixture was refluxed at 95° C. in an oil bath for 2 hours. Solvent was changed from acetone to PGME (50 g added). After solvent exchange AIBN (1.4 m % out of the siloxane polymer solids) was added to the material and the material solution was refluxed at 105° C. in an oil bath for 115 min. After reflux the solid content was adjusted to 25% by adding PGMEA. PAG290 (2% of solid polymer mass), UVI6976 (2% of solid polymer mass), BYK3700 (1% of solid polymer mass) and UVS1101 (0.5% of solid polymer mass) were added to material. After final filtration the solution is ready to use for processing. The material had a molecular weight ($M_w$) of 9016.

Example 31 n-Octyltrimethoxysilane (42.35 g), Phenyltrimethoxysilane (4.04 g), Methacryloxypropyltrimethoxysilane (2.81 g), 3-Glycidoxypropyl)methyldimethoxysilane (28.94 g), 1,2-Bis(triethoxysilyl)methane (16.05 g) were weighed to a round bottom flask. 94 g of acetone was added to the round bottom flask. 26.78 g of water (0.1 M HNO3) was added to the reaction flask and the reaction mixture was refluxed at 95° C. in an oil bath for 2 hours. Solvent was changed from acetone to PGME (60 g added). After solvent exchange AIBN (2.3 m % out of the siloxane polymer solids) was added to the material and the material solution was refluxed at 105° C. in an oil bath for 180 min. After reflux the solid content was adjusted to 25% by adding PGMEA. PAG290 (1% of solid polymer mass), UVI6976 (2% of solid polymer mass), BYK3700 (1% of solid polymer mass) and UVS1101 (0.25% of solid polymer mass) were added to material. After final filtration the solution is ready to use for processing. The material had a molecular weight ($M_w$) of 9741.

Example 32

Methyltriethoxysilane (17.8 g), Phenylmethyldimethoxysilane (4.1 g), Methacryloxypropyltrimethoxysilane (2.79 g), 3-Glycidoxypropyl)methyldimethoxysilane (26.76 g), 1,2-Bis(triethoxysilyl)methane (16.05 g) were weighed to a round bottom flask. 67.5 g of acetone was added to the round bottom flask. 16.32 g of water (0.1 M HNO3) was added to the reaction flask and the reaction mixture was refluxed at 95° C. in an oil bath for 2 hours. Solvent was changed from acetone to PGME (50 g added). After solvent exchange AIBN (2.0 m % out of the siloxane polymer solids) was added to the material and the material solution was refluxed at 105° C. in an oil bath for 180 min. After reflux the solid content was adjusted to 25% by adding PGMEA. PAG290 (1% of solid polymer mass), UVI6976 (2% of solid polymer mass), BYK3700 (1% of solid polymer mass) and UVS1101 (0.25% of solid polymer mass) were added to material. After final filtration the solution is ready to use for processing. The material had a molecular weight ($M_w$) of 8267.

Example 33

Methyltriethoxysilane (46.7 g), Phenyltrimethoxysilane (4.45 g), Methacryloxypropyltrimethoxysilane (3.1 g), 3-Glycidoxypropyl)methyldimethoxysilane (29.74 g), 1,2-Bis(triethoxysilyl)methane (17.7 g) were weighed to a round bottom flask. 101.69 g of acetone was added to the round bottom flask. 27.27 g of water (0.1 M HNO3) was added to the reaction flask and the reaction mixture was refluxed at 95° C. in an oil bath for 2 hours. Solvent was changed from acetone to PGME (50 g added). After solvent exchange AIBN (1.7 m % out of the siloxane polymer solids) was added to the material and the material solution was refluxed at 105° C. in an oil bath for 120 min. After reflux the solid content was adjusted to 25% by adding PGMEA. PAG290 (1% of solid polymer mass), UVI6976 (2% of solid polymer mass), BYK3700 (1% of solid polymer mass) and UVS1101 (0.25% of solid polymer mass) were added to material. After final filtration the solution is ready to use for processing. The material had a molecular weight ($M_w$) of 9944.

Example 34

Methyltriethoxysilane (36.77 g), Phenylmethyldimethoxysilane (4.1 g), Methacryloxypropyltrimethoxysilane (2.79 g), 3-Glycidoxypropyl)methyldimethoxysilane (26.76 g), 1,2-Bis(triethoxysilyl)methane (16.05 g) were weighed to a round bottom flask. 86.47 g of acetone was added to the round bottom flask. 24.04 g of water (0.1 M HNO3) was added to the reaction flask and the reaction mixture was refluxed at 95° C. in an oil bath for 2 hours. Solvent was changed from acetone to PGME (50 g added). After solvent exchange AIBN (1.4 m % out of the siloxane polymer solids) was added to the material and the material solution was refluxed at 105° C. in an oil bath for 150 min. After reflux the solid content was adjusted to 25% by adding PGMEA. PAG290 (1% of solid polymer mass), UVI6976 (2% of solid polymer mass), BYK3700 (1% of solid polymer mass) and UVS1101 (0.25% of solid polymer mass) were added to material. After final filtration the solution is ready to use for processing. The material had a molecular weight ($M_w$) of 6738.

Example 35

Solution 1
Methyltriethoxysilane (46.7 g), Phenyltrimethoxysilane (4.45 g), Methacryloxypropyltrimethoxysilane (3.1 g), 3-Glycidoxypropyl)methyldimethoxysilane (29.74 g), 1,2-Bis(triethoxysilyl)methane (17.7 g) were weighed to a round bottom flask. 101.69 g of acetone was added to the round bottom flask. 27.27 g of water (0.1 M HNO3) was added to the reaction flask and the reaction mixture was refluxed at 95° C. in an oil bath for 2 hours. Solvent was changed from acetone to PGME (50 g added). After solvent exchange AIBN (1.7 m % out of the siloxane polymer solids) was added to the material and the material solution was refluxed at 105° C. in an oil bath for 120 min. After reflux the solid content was adjusted to 25% by adding PGMEA. PAG290 (1% of solid polymer mass), UVI6976 (2% of solid polymer mass), BYK3700 (1% of solid polymer mass) and UVS1101 (0.25% of solid polymer mass) were added to material. After final filtration the solution is ready to use for processing. The material had a molecular weight ($M_w$) of 9944.

Solution 2
Acetone (2560 g), Methacryloxypropyltrimethoxysilane (600 g) and nitric acid (200 g) were mixed and solution was refluxed for 45 minutes. After refluxing a solvent exchange was performed to propylene glycol methyl ether. After solvent exchange AIBN (2.0 m % out of the siloxane polymer solids) was added to the material and the material solution was refluxed at 105° C. in an oil bath for 80 min. Irgacure 819 (6% of solid polymer mass) and trimethylpropane trimethacrylate (30% of solid polymer mass) were added to material.

Solutions 1 and 2 were mixed at a ratio of 5:1 and the solids content of the material was adjusted to process formulation and filtrated to obtain a process ready solution.

Example 36

Solution 1
Diphenylsilanediol (36.77 g), Phenylmethyldimethoxysilane (4.1 g), Methacryloxypropyltrimethoxysilane (2.79 g), 3-Glycidoxypropyl)methyldimethoxysilane (26.76 g), 1,2-Bis(triethoxysilyl)methane (16.05 g) were weighed to a round bottom flask. 86.47 g of acetone was added to the round bottom flask. 24.04 g of water (0.1 M HNO3) was added to the reaction flask and the reaction mixture was refluxed at 95° C. in an oil bath for 2 hours. Solvent was changed from acetone to PGME (50 g added). After solvent exchange AIBN (1.8 m % out of the siloxane polymer solids) was added to the material and the material solution was refluxed at 105° C. in an oil bath for 150 min. After reflux the solid content was adjusted to 25% by adding PGMEA. PAG290 (1% of solid polymer mass), UVI6976 (2% of solid polymer mass), BYK3700 (1% of solid polymer mass) and UVS1101 (0.25% of solid polymer mass)

were added to material. After final filtration the solution is ready to use for processing. The material had a molecular weight ($M_w$) of 7800.

Solution 2

Acetone (2560 g), Methacryloxypropyltrimethoxysilane (600 g) and nitric acid (200 g) were mixed and solution was refluxed for 45 minutes. After refluxing a solvent exchange was performed to propylene glycol methyl ether. After solvent exchange AIBN (2.0 m % out of the siloxane polymer solids) was added to the material and the material solution was refluxed at 105° C. in an oil bath for 80 min. Irgacure 819 (6% of solid polymer mass) and trimethylpropane trimethacrylate (30% of solid polymer mass) were added to material.

Solutions 1 and 2 were mixed at a ratio of 4:1 and the solid content of the material was adjusted to process formulation and filtrated to obtain a process ready solution.

Example 37 n-Hexyltrimethoxysilane (51.79 g), Phenyltrimethoxysilane (4.04 g), Methacryloxypropyltrimethoxysilane (2.81 g), 3-Glycidoxypropyl)methyldimethoxysilane (28.94 g), 1,2-Bis(triethoxysilyl)methane (16.05 g) were weighed to a round bottom flask. 103.6 g of acetone was added to the round bottom flask. 26.78 g of water (0.1 M HNO3) was added to the reaction flask and the reaction mixture was refluxed at 95° C. in an oil bath for 2 hours. Solvent was changed from acetone to PGME (50 g added). After solvent exchange AIBN (1.7 m % out of the siloxane polymer solids) was added to the material and the material solution was refluxed at 105° C. in an oil bath for 180 min. After reflux the solid content was adjusted to 25% by adding PGMEA. PAG290 (1% of solid polymer mass), UVI6976 (2% of solid polymer mass), BYK3700 (1% of solid polymer mass) and UVS1101 (0.25% of solid polymer mass) were added to material. After final filtration the solution is ready to use for processing. The material had a molecular weight ($M_w$) of 5920.

Example 38

Diphenylsilanediol (12.08 g), Methyltriethoxysilane (77.02 g), Methacryloxypropyltrimethoxysilane (5.62 g), 3-glysidoxypropyl-trimethoxysilane (57.83 g), 1,2-Bis(triethoxysilyl)ethane (35.98 g) and 1,2-Bis(trimethoxysilyl)ethane (9.3 g) were weighed to a round bottom flask. 193.8 g of acetone was added to the round bottom flask. 51.73 g of water (0.1 M HNO3) was added to the reaction flask and the reaction mixture was refluxed at 95° C. in an oil bath for 2 hours. Solvent was changed from acetone to PGME (104 g added). After solvent exchange AIBN (1.77 g) was added to the material and the material solution was refluxed at 105° C. in an oil bath for 45 min. After reflux the solid content was adjusted to 25% by adding PGMEA. PAG290 (1% of solid polymer mass), UVI6976 (2% of solid polymer mass), BYK3700 (1% of solid polymer mass) and UVS1101 (0.5% of solid polymer mass) were added to material. After final filtration the solution is ready to use for processing. The material had a molecular weight ($M_w$) of 9000.

Example 39

Phenyltrimethoxysilane (8.08 g), Methyltriethoxysilane (72.45 g), Methacryloxypropyltrimethoxysilane (5.62 g), 3-glysidoxypropyl-trimethoxysilane (57.83 g), 1,2-Bis(triethoxysilyl)ethane (48.2 g) were weighed to a round bottom flask. 199.5 g of acetone was added to the round bottom flask. 51.0 g of water (0.1 M HNO3) was added to the reaction flask and the reaction mixture was refluxed at 95° C. in an oil bath for 2 hours. Solvent was changed from acetone to cyclopentanone (109 g added). After solvent exchange AIBN (1.52 g) was added to the material and the material solution was refluxed at 105° C. in an oil bath for 60 min. After reflux the solid content was adjusted to 25% by adding cyclopentanone. PAG290 (1% of solid polymer mass), BYK3700 (1% of solid polymer mass), UVI6976 (1% of solid polymer mass) and UVS1331 (0.25% of solid polymer mass) were added to material. After final filtration the solution is ready to use for processing. The material had a molecular weight ($M_w$) of 8900.

Example 40

Phenyltrimethoxysilane (8.08 g), Methyltriethoxysilane (72.45 g), Methacryloxypropyltrimethoxysilane (5.62 g), 3-glysidoxypropyl-trimethoxysilane (57.83 g), 1,2-Bis(triethoxysilyl)ethane (48.2 g) were weighed to a round bottom flask. 199.5 g of acetone was added to the round bottom flask. 51.0 g of water (0.1 M HNO3) was added to the reaction flask and the reaction mixture was refluxed at 95° C. in an oil bath for 2 hours. Solvent was changed from acetone to cyclopentanone (109 g added). After solvent exchange AIBN (1.52 g) was added to the material and the material solution was refluxed at 85° C. in an oil bath for 90 min. After reflux the solid content was adjusted to 25% by adding PGMEA. PAG290 (1% of solid polymer mass), BYK3700 (1% of solid polymer mass), UVI6976 (1% of solid polymer mass) and UVS1331 (0.25% of solid polymer mass) were added to material. After final filtration the solution is ready to use for processing. The material had a molecular weight ($M_w$) of 10050.

The following clauses characterize embodiments:

Clause 1: A method of producing a siloxane polymer composition, the method comprising steps of
(a) providing at least four different silane monomers and at least one bi-silane;
 admixing at least two silane monomers and at least one bi-silane to a first solvent(s) to form a first mixture,
 admixing at least one silane monomer to a second solvent(s), to form a second mixture,
  with the proviso that at least one of the silane monomers or the bi-silane comprises an active group capable of achieving cross-linking to adjacent siloxane polymer chains of the siloxane polymer composition;
(b) subjecting the first and the second mixtures to acid treatment so that the silane monomers are at least partially hydrolysed, and the hydrolysed silane monomers, the silane monomers and the bi-silane are at least partially polymerized and cross-linked to form a first and a second polymer composition;
(c) optionally changing the first and the second solvents to a third solvent;
(d) mixing the first and the second polymer compositions to form a combined polymer composition and
(e) subjecting the combined polymer composition to further cross-linking of the siloxane polymer to achieve a predetermined degree of cross-linking.

2. A method according to clause 1, wherein the first and the second polymer compositions are mixed at a polymer weight ratio of 1.1:1 to 100:1, in particular 1.5:1 to 50:1, for example 2:1 to 15:1. In the below examples, the ratios are in the range of 2.5:1 to 7.5:1.

3. A method according to clause 1 or 2, wherein the second polymer composition is obtained by polymerizing at least one monomer containing an active group, in particular an active group capable of achieving cross-linking to adjacent siloxane polymer chains upon a thermal or radiation initiation.

4. A method according to any of clauses 1 to 3, wherein the first polymer composition contains the bi-silane monomer.

5. A method according to any of clauses 1 to 4, wherein the first polymer composition is produced from four monomers and the second polymer composition is produced from one monomer.

INDUSTRIAL APPLICABILITY

As will appear, the coating prepared using the siloxane polymer composition of the present invention are useful for lithographic fabrication processes, in particular in connection with the manufacture of displays and semiconductor devices. As shown in the foregoing, the present siloxane polymer compositions are significantly harder than the coating prepared by using the siloxane polymer of prior art (up to 8H vs 4H of that of WO2009/068755). Tests also showed that the adhesion of the material to various surfaces was better, and the chemical resistance was significantly improved. One additional significant improvement, what is highlighted in the table is that the polymer compositions of the present invention do not require so called post exposure bake step in the lithography process.

The invention claimed is:

1. A method for covering a substrate, the method comprising:
   producing a siloxane polymer composition comprising:
   (a) admixing at least four different silane monomers and at least one bi-silane to a first solvent(s) to form a mixture,
      with the proviso that at least one of the silane monomers comprises an active group capable of achieving cross-linking to adjacent siloxane polymer chains of the siloxane polymer composition;
      wherein the first solvent(s) is selected from the group consisting of acetone, methyl ethyl ketone, methyl isobutyl ketone and mixtures thereof, and
      wherein the at least one bi-silane is selected from 1,2-bis(trimethoxysilyl)ethane, 1,2-bis(triethoxysilyl)ethane, bis(trimethoxysilyl)methane, 4,4'-Bis(triethoxysilyl)-1,1'-biphenyl 1,2-bis(triethoxysilyl)ethane, 1-(dimethoxymethylsilyl)-1-(trimethoxysilyl)methane, 1-(diethoxymethylsilyl)-1-(triethoxysilyl)methane, 1-(dimethoxymethylsilyl)-2-(trimethoxysilyl)ethane, 1-(diethoxymethylsilyl)-2-(triethoxysilyl)ethane, bis(dimethoxymethylsilyl)methane, bis(diethoxymethylsilyl)methane 1,2-bis(dimethoxymethylsilyl)ethane, bis(diethoxymethylsilyl)ethane, 1,2-bis(trimethoxysilyl)benzene, 1,2-bis(triethoxysilyl)benzene, 1,3-bis(trimethoxysilyl)benzene, 1,3-bis(triethoxysilyl)benzene, 1,4-bis(trimethoxysilyl)benzene, 1,4-bis(triethoxysilyl)benzene, and combinations thereof;
   (b) subjecting the mixture to an acid treatment so that the silane monomers are at least partially hydrolysed, and the hydrolysed silane monomers, the silane monomers and the bi-silane are at least partially polymerized and cross-linked;
   (c) optionally changing the first solvent to a second solvent; and
   (d) subjecting the mixture to further cross-linking of the siloxane polymer to achieve a predetermined degree of cross-linking;
   depositing the siloxane polymer composition on the substrate; and
   optionally curing the deposited siloxane polymer composition.

2. The method according to claim 1, wherein the active group is selected from epoxy, vinyl, allyl and methacrylate group.

3. The method according to claim 1, wherein 0.1 to 70% of the silane monomers comprise the active groups based on the molar portion of monomers.

4. The method according to claim 1, wherein the second solvent(s) is/are selected from 1-methoxy-2-propanol, propylene glycol monomethylether acetate (PGMEA), methyl ethyl ketone or propylene glycol propyl ether (PnP) or methyl isobutyl ketone, cyclopentatone and mixtures thereof.

5. The method according to claim 1, wherein the at least four silane monomers are selected from molecules formula $$R^1_a SiX_{4-a} \qquad \text{I}$$

$$R^2_b SiX_{4-b} \qquad \text{II,}$$

$$R^3_c SiX_{4-c} \qquad \text{III, and}$$

$$R^4_d SiX_{4-d} \qquad \text{IV}$$

wherein
$R^1$, $R^2$, $R^3$ and $R^4$ are independently selected from hydrogen and a group comprising linear and branched alkyl, cycloalkyl; alkenyl, alkynyl, (alk)acrylate, epoxy, allyl, vinyl and alkoxy and aryl having 1 to 6 rings, and wherein the group is substituted or unsubstituted; X is a hydrolysable group or a hydrocarbon residue; and
a, b, c and d are independently an integer 1 to 3.

6. The method according to claim 5, wherein the alkoxy groups are selected from the group of radicals having the formula $$-O-R^5 \qquad \text{V}$$

wherein $R^5$ is a linear or branched alkyl group having 1 to 10 carbon atoms, and exhibiting one or two substituents selected from the group of halogen, hydroxyl, vinyl, epoxy and allyl.

7. The method according to claim 1, wherein the at least one bi-silane is selected from molecules of formula $$(R^6)_3Si-Y-Si(R^7)_3, \qquad \text{VI}$$

wherein
$R^6$ and $R^7$ are independently selected from hydrogen and a group consisting of linear or branched alkyl, cycloalkyl, alkenyl, alkynyl, (alk)acrylate, epoxy, allyl, vinyl, alkoxy and aryl having 1 to 6 rings, and wherein the group is substituted or unsubstituted; and
Y is a linking group selected from bivalent unsubstituted and substituted aliphatic groups unsubstituted and substituted aromatic groups, alkylene, arylene, —O-alkylene-O—; —O-arylene-O—; alkylene-O-alkylene, arylene-O-arylene; alkylene-$Z^1$C(=O)$Z^2$-alkylene, arylene-$Z^1$C(=O)$Z^2$-arylene and —O-alkylene-$Z^1$(=O)$Z^2$-alkylene-O—; —O-arylene-$Z^1$(=O)$Z^2$-arylene-O—, wherein $Z^1$ and $Z^2$ are each selected from a direct bond or —O—.

8. The method according to claim 1, wherein the at least four silane monomers are selected from triethoxysilane, tetraethoxysilane, methyltriethoxysilane, methyltrimethoxysilane, ethyltriethoxysilane, n-butyltriethoxysilane, methyldiethoxyvinylsilane, dimethyldiethoxysilane, phenyltrimethoxysilane, phenantrene-9-triethoxysilane, vinyltrimethoxysilane, 3-glysidoxypropyltrimethoxysilane, aminopropyltrimethoxysilane, methacryloxypropyltrimethoxysilane, methacryloxypropyltriethoxysilane, acryloxypropyl-trimethoxysilane, allyltrimethoxysilane, epoxycyclohexylethyltrimethoxysilane, diphenylsilanediol, dimethyldimethoxysilane, 1-(2-(Trimethoxysilyl)ethyl)cyclohexane-3,4-epoxide, 1H, 1H, 2H, 2H-perfluorodecylt-rimethoxysilane, trimethoxy (3,3,3-trifluoropropyl)silane, in particular methyltriethoxysilane, phenyltrimethoxysilane, 3-methacryloxypropyltrimethoxysilane, diphenylsilanediol, and glycidoxypropyltrimethoxysilane and combinations thereof.

9. The method according to claim 1, the method further comprising
  (e) admixing with one more substances selected from the group of photoacid initiators, and UV sensitizer.

10. The method according to claim 1, further comprising adding a UV initiator to initiate cross-linking of the siloxane polymer to provide a cured polymer.

11. The method according to claim 1, the method further comprising admixing with nano- and/or microparticles, wherein the nano and/or microparticles are selected from light scattering pigments, organic and inorganic phosphors, oxides, quantum dots and metals.

12. The method according to claim 1, wherein the deposited siloxane polymer composition forms a film, in particular a thin film on the substrate, and wherein the solvent is evaporated and the film dried.

13. The method according to claim 1, the method further comprising exposing the siloxane polymer composition to UV light.

14. The method according to claim 1, the method further comprising developing the siloxane polymer composition, by exposing at least a partial area of the deposited siloxane polymer composition to UV light, and by removing unexposed areas of the film.

15. The method according to claim 14, wherein developing comprises treatment with a basic solution.

16. The method according to claim 15, wherein the developing is carried out after any pre-curing and before a final curing.

17. The method according to claim 1, the method further comprising curing the siloxane polymer film.

18. The method according to claim 17, wherein the curing is done by heating, at temperature between 80° C. and 300° C.

19. The method according to claim 1, wherein the substrate is selected from a material comprising glass, quartz, silicon, silicon nitride, polymers, metals and plastics or mixtures thereof.

* * * * *

UNITED STATES PATENT AND TRADEMARK OFFICE
CERTIFICATE OF CORRECTION

| | |
|---|---|
| PATENT NO. | : 11,634,610 B2 |
| APPLICATION NO. | : 17/479009 |
| DATED | : April 25, 2023 |
| INVENTOR(S) | : Karkkainen et al. |

It is certified that error appears in the above-identified patent and that said Letters Patent is hereby corrected as shown below:

In the Specification

In Column 4, Line 9, delete "byclohexanone" and insert -- cyclohexanone --;

In Column 4, Line 20, delete "Ircacure" and insert -- Irgacure --;

In Column 4, Line 22, delete "amd" and insert -- and --;

In Column 8, Line 63, delete "visa" and insert -- vice --;

In Column 23, Table 1, Line 39, delete "Spectrophometer" and insert -- Spectrophotometer --;

In the Claims

In Column 32, Claim 5, Line 32, delete "cycloalkyl;" and insert -- cycloalkyl, --; and In Column 32, Claim 7, Line 57, delete "groups" and insert -- groups, --.

Signed and Sealed this
Fifth Day of December, 2023

Katherine Kelly Vidal
*Director of the United States Patent and Trademark Office*